(12) United States Patent
Hamada et al.

(10) Patent No.: US 12,646,542 B2
(45) Date of Patent: Jun. 2, 2026

(54) PRE-CHARGER CIRCUIT OF MEMORY DEVICE AND METHODS FOR OPERATING THE SAME

(71) Applicant: Taiwan Semiconductor Manufacturing Company, Ltd., Hsinchu (TW)

(72) Inventors: Masaya Hamada, Hsinchu (TW); Takumi Hara, Hsinchu (TW); Makoto Yabuuchi, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 273 days.

(21) Appl. No.: 18/331,558

(22) Filed: Jun. 8, 2023

(65) Prior Publication Data

US 2024/0412766 A1 Dec. 12, 2024

(51) Int. Cl.
| | |
|---|---|
| *G11C 7/12* | (2006.01) |
| *G11C 7/22* | (2006.01) |
| G11C 5/14 | (2006.01) |
| G11C 8/08 | (2006.01) |
| G11C 8/10 | (2006.01) |
| G11C 13/00 | (2006.01) |

(52) U.S. Cl.
CPC ................ *G11C 7/12* (2013.01); *G11C 7/222* (2013.01); *G11C 5/147* (2013.01); *G11C 8/08* (2013.01); *G11C 8/10* (2013.01); *G11C 13/00* (2013.01)

(58) Field of Classification Search
CPC ........... G11C 7/12; G11C 7/222; G11C 13/00; G11C 5/147; G11C 8/08; G11C 8/10
See application file for complete search history.

(56) References Cited

U.S. PATENT DOCUMENTS

| | | | |
|---|---|---|---|
| 6,188,608 B1 | 2/2001 | Maruyama et al. | |
| 6,292,416 B1 | 9/2001 | Reddy et al. | |
| | (Continued) | | |

FOREIGN PATENT DOCUMENTS

| | | |
|---|---|---|
| EP | 2 211 352 B1 | 7/2010 |
| TW | 446951 B | 7/2001 |
| | (Continued) | |

OTHER PUBLICATIONS

Office Action issued in connection with Taiwan Appl. No. 112137540 dated Sep. 2, 2024.

*Primary Examiner* — Alexander Sofocleous
*Assistant Examiner* — Joseph Fidelis Stormes
(74) *Attorney, Agent, or Firm* — Foley & Lardner LLP

(57) ABSTRACT

A memory circuit includes a plurality of first memory cells. The plurality of first memory cells are operatively coupled to a first bit line. The memory circuit further includes a first pre-charge circuit connected to a first end of the first bit line and configured to charge the first bit line to a supply voltage during a first time period prior to any of the first memory cells being accessed. The memory circuit further includes a second pre-charge circuit connected to a second end of the first bit line and also configured to charge the first bit line to the supply voltage during the first time period. The second pre-charge circuit is only activated during a second time period at a beginning of the first time period, while the first pre-charge circuit is activated during a whole of the first time period.

20 Claims, 19 Drawing Sheets

(56)  References Cited

U.S. PATENT DOCUMENTS

| | | | |
|---|---|---|---|
| 6,333,881 B1 * | 12/2001 | Kusunoki ............. | G11C 11/419 |
| | | | 365/189.14 |
| 2006/0023555 A1 * | 2/2006 | Morishima ........... | G11C 11/413 |
| | | | 365/230.03 |
| 2018/0158514 A1 * | 6/2018 | Freese ...................... | G11C 5/14 |

FOREIGN PATENT DOCUMENTS

| | | | |
|---|---|---|---|
| TW | 1379308 | B | 12/2012 |
| TW | 201743336 | A | 12/2017 |

* cited by examiner

700

1100

1500

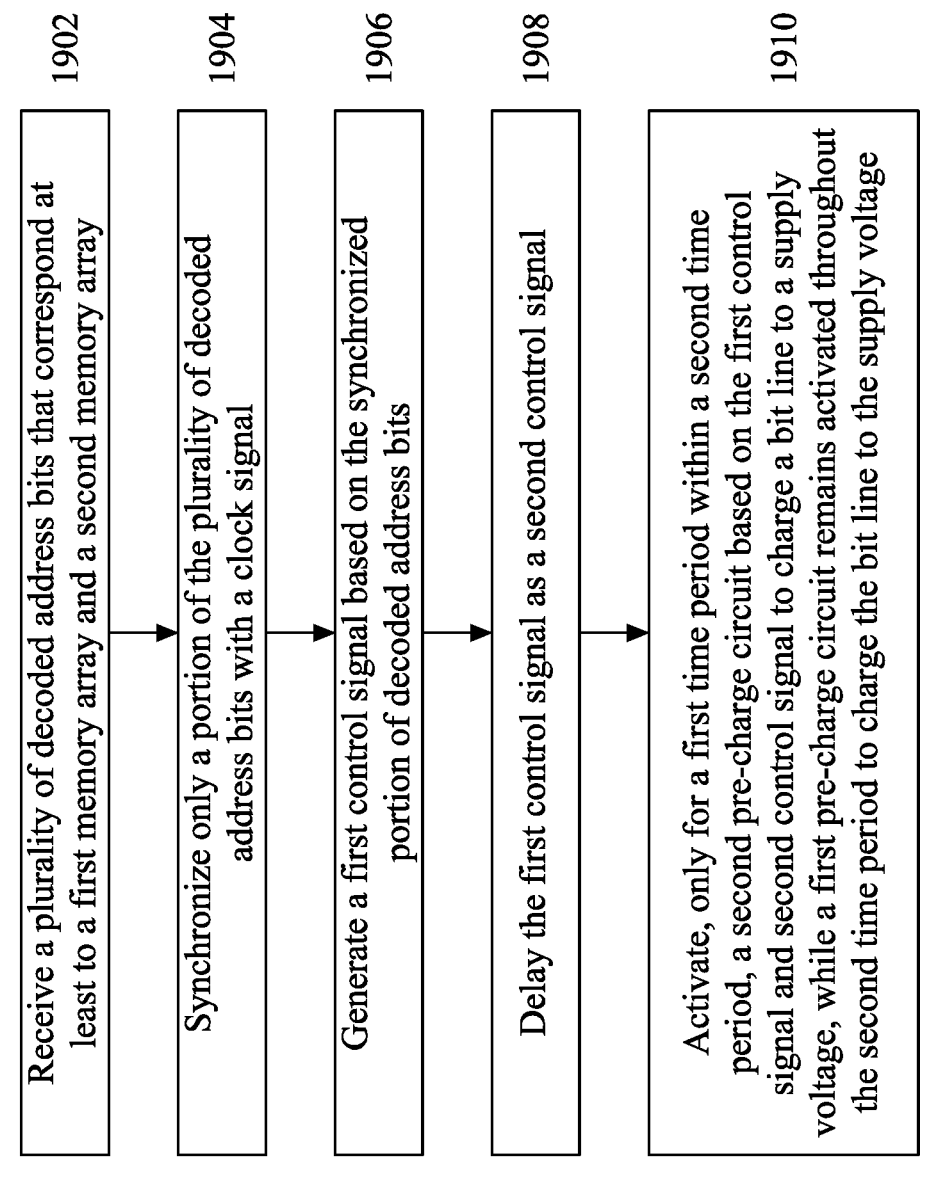

1902

Receive a plurality of decoded address bits that correspond at least to a first memory array and a second memory array

1904

Synchronize only a portion of the plurality of decoded address bits with a clock signal

1906

Generate a first control signal based on the synchronized portion of decoded address bits

1908

Delay the first control signal as a second control signal

1910

Activate, only for a first time period within a second time period, a second pre-charge circuit based on the first control signal and second control signal to charge a bit line to a supply voltage, while a first pre-charge circuit remains activated throughout the second time period to charge the bit line to the supply voltage

PRE-CHARGER CIRCUIT OF MEMORY DEVICE AND METHODS FOR OPERATING THE SAME

BACKGROUND

The semiconductor integrated circuit industry has produced a wide variety of digital devices to address issues in a number of different areas. Some of these digital devices, such as memory macros, are configured for the storage of data. A high parasitic resistivity and capacity of a long bit line (BL)/bit line bar (BLB) metal wiring increases BL pre-charge time, which can result in a low operating frequency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 illustrates a flow chart of an example method for operating the far-side pre-charger circuit of FIG. 1, in accordance with some embodiments.

DETAILED DESCRIPTION

Figure 1:
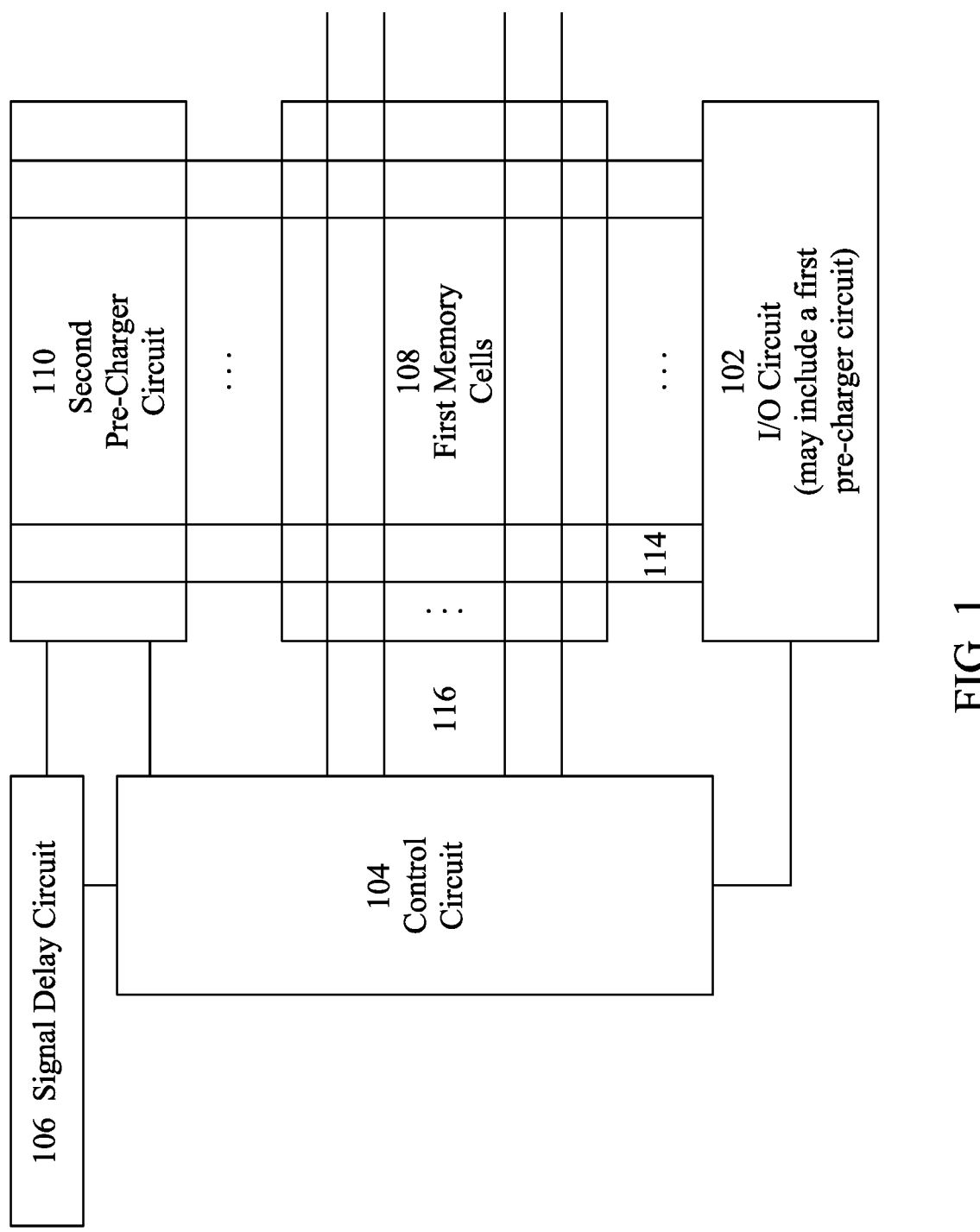
FIG. 1 illustrates a block diagram of a system including a far-side pre-charger circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a far-side pre-charger circuit that can shorten bit line (BL) pre-charge operation time. The far-side pre-charger circuit can be applied for all of memory macros using bit lines, especially, for memory macros that face an issue of a large pre-charge time of BLs. The present disclosure can improve an operating frequency of a memory array having bit lines (BLs) by shortening BL pre-charge operation time by using an additional pre-charger (PC) with a self-operation timing generator.

FIG. 1 illustrates a block diagram of a circuit 100 including a far-side pre- charger circuit, according to some embodiments of the present disclosure. The circuit 100 may include an input/output (I/O) circuit 102, a control circuit 104, a signal delay circuit 106, a plurality of first memory cells 108, a second pre-charger circuit 110, a number of bit lines (BLs) 114, and a number of word lines (WLs) 116. Despite not being explicitly shown in FIG. 1, the components of the plurality of first memory cells 108 may be operatively coupled to each other and to the control circuit 104. For example, the control circuit 104, the I/O circuit 102, the second pre-charger circuit 110 may be operatively (e.g., electrically) coupled to the plurality of first memory cells 108, in some embodiments. Although, in the illustrated example of FIG. 1, the components are shown as separate blocks for the purpose of clear illustration, in some other embodiments, some or all of the components shown in FIG. 1 may be integrated together. For example, the plurality of first memory cells 108 may include an embedded I/O circuit 102.

The I/O circuit 102 can be a hardware component that can access (e.g., read, program) each memory cell of the plurality of first memory cells 108 asserted through a row decoder and a column decoder. The I/O circuit 102 can be used to input electronic signals to and output electronic signals from integrated circuits. The integrated circuits may include the control circuit 104, the plurality of first memory cells 108, and the second pre-charger circuit 110.

The input/output (I/O) circuit 102 may include a first pre-charge circuit. In some embodiments, the first pre-charge circuit can be a pre-charger circuit near the I/O circuit. The first pre-charge circuit (e.g., a normal pre-charger) can be connected to a first end of the number of bit lines (BLs) 114 and configured to charge any of the number of bit lines (BLs) 114 to a supply voltage prior to any of memory cells being accessed.

The control circuit 104 can be a hardware component that can control the coupled components (e.g., 102, 106, 108, 110, 114, and/or 116). In some embodiments, the control circuit 104 may include a row decoder and a column decoder. The row decoder can be a hardware component that can receive a row address (e.g., a binary row address) of the plurality of first memory cells 108 and can assert one or more conductive structures (e.g., a word line) at that row address. The column decoder is a hardware component that can receive a column address (e.g., a binary column address) of the plurality of first memory cells 108 and can assert one or more conductive structures (e.g., a bit line, a source line) at that column address. The row and column decoders can be used to select a particular memory location in an array (e.g., the plurality of first memory cells 108), based on the binary row and column addresses. The control circuit 104 can be configured to generate a first control signal based on a portion of a plurality of decoded address bits (e.g., a number of word lines). The first control signal can be used for controlling word lines drivers far from the I/O circuit 102 to generate word line signals. The portion of the plurality of decoded address bits may correspond to locations of a subset of the first memory cells 108 that are physically located closer to the second end (e.g., locations of the first memory cells 108 closer to the second (far-side) pre-charger circuit 110) of the number of bit lines 114. In some embodiments, the portion of decoded address bits can be synchronized with a clock signal (e.g., internal clock (intCLK) signal), while one or more remaining portions of the plurality of decoded address bits are not synchronized with the clock signal. The internal clock (intCLK) signal may determine a pulse width of a word line (WL) signal. The one or more remaining portions of the plurality of decoded address bits may correspond to locations of one or more subsets of the first memory cells 108 that are physically located closer to the first end (e.g., locations of the first memory cells 108 closer to the I/O circuit 102). The control circuit 104 may comprise one or more logic gates configured to generate a first control signal based on the portion of decoded address bits. In some embodiments, the control circuit 104 may include at least one of: one or more NAND gates, one or more NOR gates, one or more inverters, or one or more OR gates. In the control circuit 104, the logic gates may make decisions based on a combination of digital signals coming from its inputs.

Figure 4:
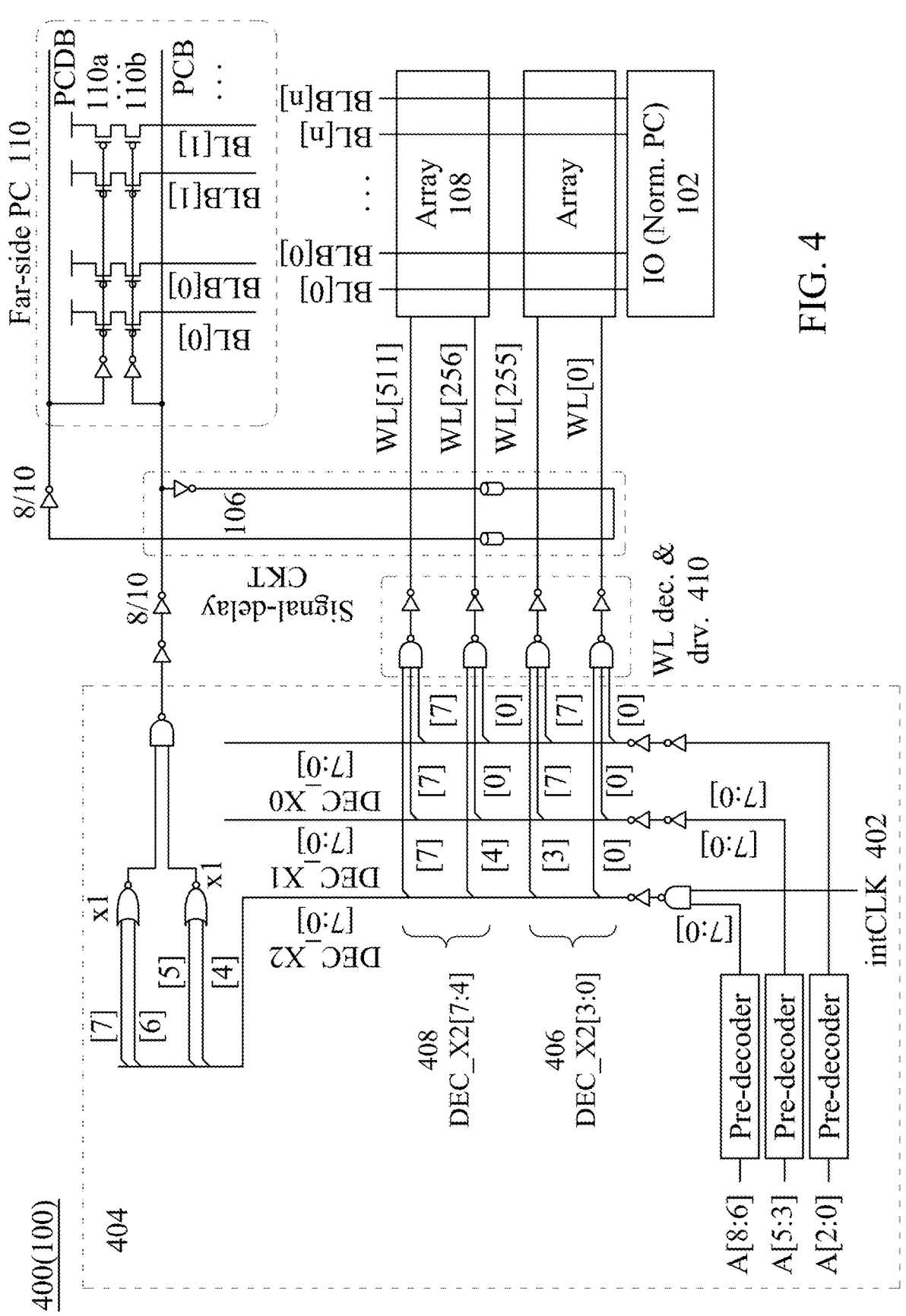
FIG. 4 illustrates a first implementation of the far-side pre-charger circuit of FIG. 2 in a static random access memory (SRAM), in accordance with some embodiments.

The signal delay circuit 106 can be a self-operation timing generator. The signal delay circuit 106 can be configured to delay a first control signal as a second control signal. For example, the signal delay circuit 106 may generate a delay-signal (e.g., a second control signal) by adding a certain delay time to a signal (e.g., a first control signal). The certain delay time to the signal may control an operation period of the second pre-charge circuit 110. The first control signal and the second control signal (e.g., a delay-signal) can be transmitted to the second pre-charge circuit 110. The first control signal may inform/notify the second pre-charge circuit 110 (e.g., a far-side pre-charger) to start charging the number of bit lines (BLs) 114 (e.g., ON state). The second control signal (e.g., a delay-signal) may inform/notify the second pre-charge circuit 110 (e.g., a far-side pre-charger) to stop charging the number of bit lines (BLs) 114 (e.g., OFF state). The certain delay time to the first control signal may be determined based on charging time of the number of bit lines (BLs) 114. FIG. 4 shows an exemplary configuration of the signal delay circuit 106 of FIG. 1. For example, a wiring that is parallel to the number of bit lines (BLs) 114 can be used to adjust the delay time. In other words, the delay time can depend on a length of the wiring (e.g., length of the bit lines).

The plurality of first memory cells 108 can be a hardware component that stores data. In one aspect, the plurality of first memory cells 108 can be embodied as a semiconductor memory device. In some embodiments, each memory cell of the plurality of first memory cells 108 can be arranged in the intersection of a corresponding word line and a corresponding bit line and can be operated according to voltages or currents through the respective conductive structures of the column and row. The plurality of first memory cells 108 can be operatively coupled to at least one bit line (e.g., a first bit line). In some embodiments, the plurality of first memory cells may include a first memory array and a second memory array. The first memory array and the second memory array may include a number of bit lines (BLs) and a number of word lines (WLs).

In some embodiments, the circuit 100 may include a plurality of second memory cells. The plurality of second memory cells can be operatively coupled to at least one bit line (e.g., a second bit line). The first pre-charge circuit can be connected to a first end of the second bit line and configured to charge the second bit line to the supply voltage. The second pre-charge circuit 110 can be connected to a second end of the second bit line and also configured to charge the second bit line to the supply voltage.

The second pre-charge circuit 110 (e.g., a far-side pre-charger) may be connected to a second end of the number of bit lines (BLs) 114 and configured to charge any of the number of bit lines (BLs) 114 to a supply voltage prior to any of memory cells being accessed. The second pre-charge circuit can be a pre-charger circuit far from the I/O circuit. The second pre-charge circuit can be activated based on the first control signal and the second control signal. The first control signal can be a pre-charge bar (PCB) signal. The PCB signal may inform/notify the second pre-charge circuit 110 (e.g., a far-side pre-charger) to start charging the number of bit lines (BLs) 114 (e.g., ON state). For example, when the PCB signal becomes low (e.g., 0), the far-side pre-charger may start charging bit lines (e.g., ON state). The second control signal can be a pre-charge delay bar (PCDB) signal. The second control signal (e.g., a delayed signal) may inform/notify the second pre-charge circuit 110 (e.g., a far-side pre-charger) to stop charging the number of bit lines (BLs) 114 (e.g., OFF state). For instance, when the PCDB signal becomes low (e.g., 0), the far-side pre-charger may stop charging bit lines (e.g., OFF state). FIG. 4 shows an exemplary configuration of the far-side pre-charger 110 of FIG. 1. The second pre-charge circuit 110 may include a first transistor 110a and a second transistor 110b coupled to each other in series. In some embodiments, the first transistor 110a and the second transistor 110b may be formed of a P-channel MOS field effect transistor. The coupled first and second transistors can be further coupled between a supply voltage and at least one bit line. The first transistor and the second transistor can be gated by the first control signal (e.g., PCB signal) and the second control signal (e.g., PCDB signal), respectively. The first transistor may have a gate for receiving the first control signal. The second transistor may have a gate for receiving the second control signal.

The first pre-charger circuit (e.g., a normal PC) 102 and the second pre-charger circuit (e.g., a far-side PC) 110 may supply a charge to at least one bit line to increase electric potential of the at least one bit line. The far-side PC 110 may charge the at least one bit line from the far side of the IO unit 102. An operation period of charging time by the far-side PC can be determined by a signal of start (e.g., the first control signal) and ones (e.g., the second control signal) generated from the signal of start by adding a delay time. The delay time can depend on a length of a wiring (e.g., length of bit lines) in the signal delay circuit 106.

Figure 2:
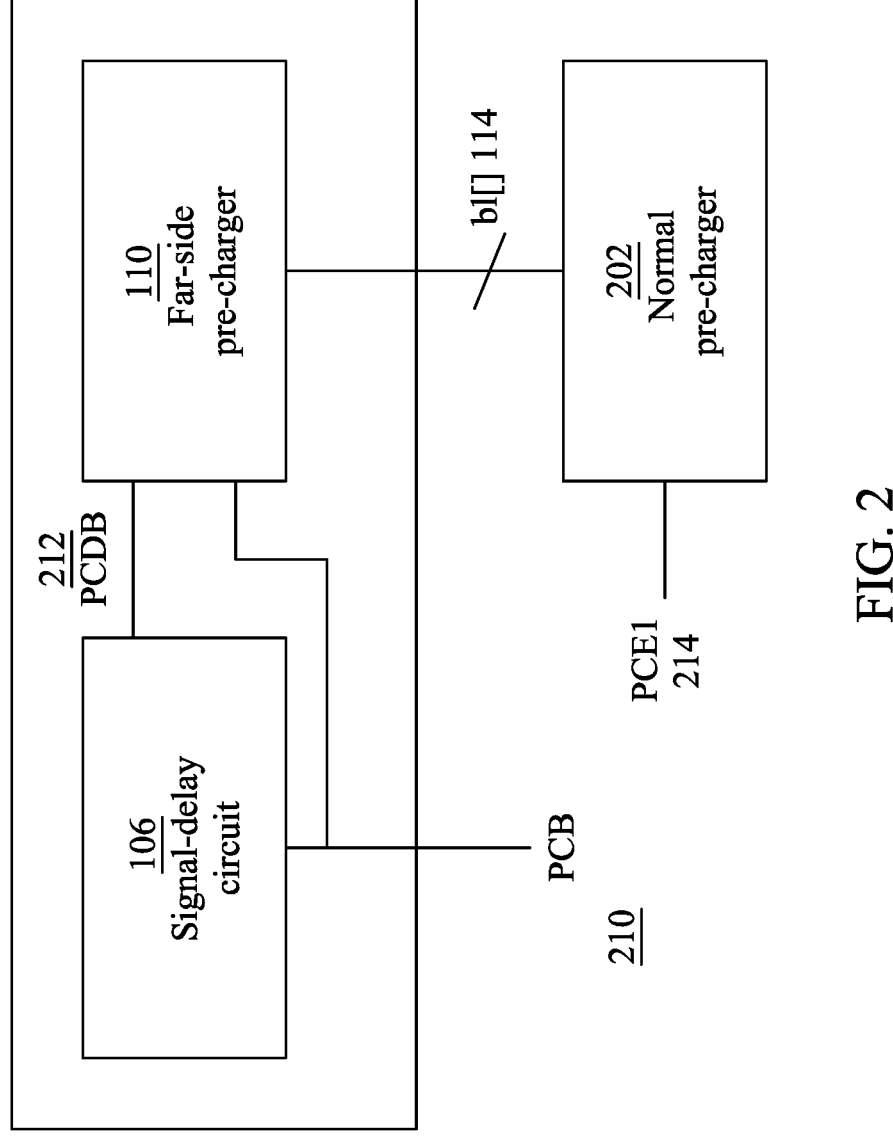
FIG. 2 illustrates a block diagram of a system including a far-side pre-charger circuit, in accordance with some embodiments.

FIG. 2 illustrates a block diagram of a system 200 including a far-side pre-charger circuit, in accordance with some embodiments. The system 200 may include a normal pre-charger (PC) 202, a signal-delay circuit 106, a far-side pre-charger (PC) 110, and a number of bit lines 114. The system 200 can be applied for all of memory macros using bit lines and facing an issue of a large pre-charge time for bit lines.

The far-side pre-charger (PC) 110 and the normal pre-charger (PC) may pre-charge the number of bit lines (BLs) 114 from both ends of the bit lines to shorten bit line pre-charge time prior to any of memory cells being accessed. Both the normal PC and the far-side PC can be configured to supply a charge (e.g., increase electric potential of the bit lines) to the bit lines to an operating voltage (e.g., VDD). The pre-charging time of the bit lines can be shortened due to the multiple voltage supplies.

A first control signal (e.g., a pre-charge bar (PCB) signal 210) may control a pre-charge start timing of the far-side PC 110. The PCB signal may inform/notify the second pre-charge circuit 110 (e.g., a far-side pre-charger) to start charging the number of bit lines (BLs) 114 (e.g., ON state). For example, when the PCB signal becomes low (e.g., 0), the far-side pre-charger may start charging bit lines (e.g., ON state). The signal-delay circuit 106 may generate a second control signal (e.g., a pre-charge delay bar (PCDB) signal 212) from the first control signal by adding a delay time. The second control signal (e.g., a PCDB signal 212) may control a pre-charge end signal of the far-side PC 110. The far-side PC 110 can be controlled with by the first control signal (e.g., a pre-charge start signal PCB 210) and the second control signal (e.g., a pre-charge end signal PCDB 212) although the normal PC 202 can be controlled with a third control signal (e.g., a pre-charge enable (PCE1) signal 214). The second control signal can be a pre-charge delay bar (PCDB) signal. The PCDB signal may inform/notify the second pre-charge circuit 110 (e.g., a far-side pre-charger) to stop charging the number of bit lines (BLs) 114 (e.g., OFF state). For instance, when the PCDB signal becomes low (e.g., 0), the far-side pre-charger may stop charging bit lines (e.g., OFF state). The third control signal can be a pre-charge enable (PCE1) signal. The third control signal (e.g., PCE1 signal) may inform/notify the normal pre-charge circuit 202 to stop charging the number of bit lines (BLs) 114 (e.g., OFF state). The PCE1 signal and the PCB signal may switch to high voltage (e.g., 1) at different time due to a net delay (e.g., wire delay or interconnect delay). A certain bit line pre-charge duration (e.g., operation period) of the far-side pre-charger 110 can be determined based on the PCB 210 and the PCDB 212 signals. A start time of the pre-charging can be indicated by the PCB 210 signal. An end time of the pre-charging can be indicated by the PCDB 212 signal. The far-side pre-charger 110 may supply charges/increase electric potential to the bit lines for the certain bit line pre-charge duration.

In the present disclosure, a delay of pre-charge end is greatly suppressed because of using the PCDB signal generated from the start signal PCB near the far-side pre-charger. Both the normal PC and the far-side PC can be configured to supply a charge (e.g., increase electric potential of the bit lines) to the bit lines to an operating voltage (e.g., VDD). The pre-charging time of the bit lines can be shortened due to the multiple voltage supplies. Therefore, next operations (such as read/write) can start fast because the shortened pre-charging time. In addition, a short duration of ending bit line pre-charge ensures that there is no continuous flow of current from bit lines to selected memory cells, which prevents any undesired interference during the memory's active read and write processes.

Figure 3:
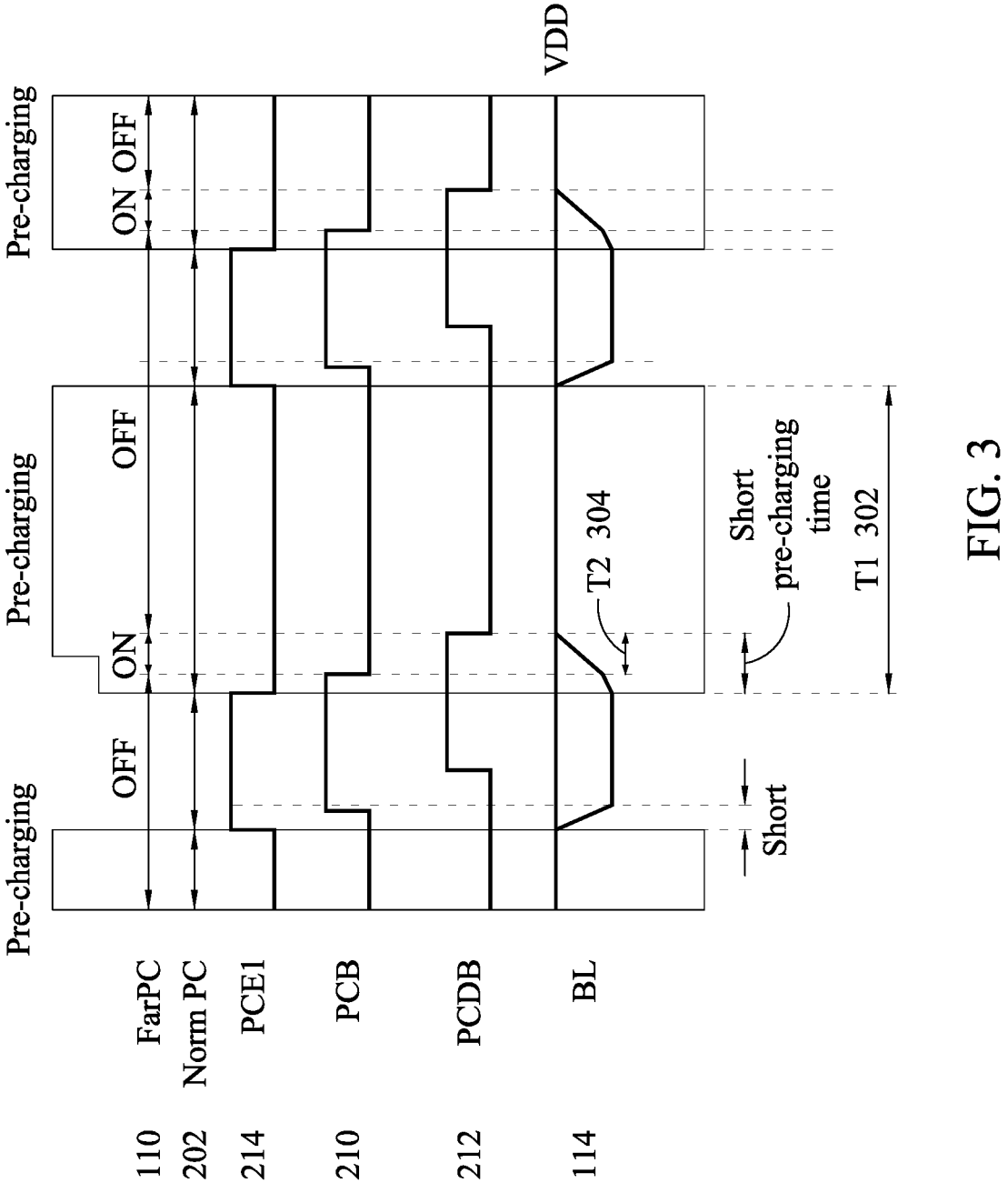
FIG. 3 illustrates waveforms of multiple signals presented by the block diagram of FIG. 2, in accordance with some embodiments.

FIG. 3 illustrates analog waveforms of the far-side pre-charger (PC) 110, the normal pre-charger (PC) 202, the control signals (e.g., PCB 210, PCDB 212, PCE1 214), and a bit line (far from the I/O circuit) voltage 114 (e.g., voltage of far side bit lines) presented by the system 200 of FIG. 2 over time, according to some embodiments of the present disclosure. Both the far-side PC 110 and the normal PC 202 may charge at least one bit line to an operating voltage (e.g., a VDD voltage). In the case where there is only a normal PC, an electric potential of a part of the bit line that is close to an I/O unit may increase quickly. The challenges can be that the increase in the electric potential of the part far from the I/O unit can be slowed by a resistance of the bit line. This effect increases especially with a large sized memory. Therefore, by adding the far-side PC 110 to the end of the bit line on the opposite side of the I/O unit, even a long bit line can be charged faster, which may increase a memory operating speed.

The PCE1 signal 214, the PCB signal 210, the PCDB signal 212 can be configured in a first voltage level (e.g., a low voltage; or 0) for the example system 200 shown in FIG. 2. During no-operation of the system 200 (e.g., a static random access memory (SRAM)), all pre-decode signals (e.g., pre-decode signals for word lines 116) are low, the PCB signal 210 and the PCDB signal 212 can be low (e.g., 0). These conditions make the far-side PC 110 and word line drivers unactive/inactive.

When the system 200 (e.g., a SRAM) starts an operation, at least one of the pre-decode signals (e.g., pre-decode signals for the number of word lines 116) becomes high, the number of word lines (WLs) 116 and the PCB signal 210 may shift from the first voltage level (e.g., a low voltage; 0) to a second voltage level (e.g., a high voltage; 1). In these conditions, the far-side PC 110 may remain an OFF-state.

Once all pre-decode signals (e.g., pre-decode signals for the number of word lines 116) are low (e.g., 0), the number of word lines (WLs) 116 and the PCB signal 210 may shift from the second voltage level (e.g., 1) to the first voltage level (e.g., 0). When the PCB signal 210 switches to the low voltage level (e.g., 0), the PCB signal may trigger the far-side PC 110 to start pre-charging (e.g., ON state) the bit lines. Because of a delay of a PCDB signal 212 falling, the PCB signal 210 and the PCDB signal 212 can be low and high, respectively. In such condition, the far-side PC 110 starts bit line (BL) 114 pre-charging. After a certain duration (e.g., T2 304), the PCDB signal 212 switches to the low voltage level (e.g., 0). The PCB signal may trigger the far-side PC 110 to stop pre-charging (e.g., OFF state) the bit lines. The certain duration (e.g., T2 304; operation period of the far-side PC) can be determined by a difference between the PCB and the PCDB signal falling edges.

As shown in FIG. 3, the PCB signal 210 may control a pre-charge start (e.g., an ON-state) timing of the far-side PC 110 (e.g., the start of T2 304). A pre-charge end signal PCDB 212 can be generated by the signal-delay circuit 106 by adding a delay time to the PCB signal 210. The PCDB signal 212 can control a pre-charge end (e.g., an OFF-state) timing of the far-side PC 110 (e.g., the end of T2 304). The delay time can depend on a length of a wiring (e.g., length of bit lines) in the signal delay circuit 106. The far-side PC 110 can be controlled with by the pre-charge start signal PCB 210 and the pre-charge end signal PCDB 212. The PCB signal may inform/notify the far-side PC 110 to start charging the bit lines (e.g., ON state). For example, when the PCB signal becomes low (e.g., 0), the far-side pre-charger may start charging bit lines (e.g., ON state). The PCDB signal may inform/notify the far-side PC 110 to stop charging the bit lines (BLs) 114 (e.g., OFF state). For instance, when the PCDB signal becomes low (e.g., 0), the far-side pre-charger may stop charging bit lines (e.g., OFF state). The normal PC 202 can be controlled with one control signal PCE1 214. The PCE1 signal 214 may inform/notify the normal pre-charge circuit 202 to stop charging the bit lines (BLs) 114 (e.g., OFF state). The PCB signal 210 and the PCDB signal 212 may determine a certain BL pre-charge duration (e.g., T2 304). The far-side PC may supply charges to the bit lines only for the certain BL pre-charge duration (e.g., T2 304). The normal PC 202 can be activated (e.g., ON-state) during a whole of a first time period (e.g., T1 302). The far-side PC 110 and the normal PC 202 can turn on at the same time. In some embodiments, the far-side PC110 is ON only a period 304 after pre-charging starts as shown in FIG. 3 while the normal PC 202 is always on during pre-charging operation (e.g., T1 302). For example, the far-side PC 110 switches to an ON-state only during a period (e.g., T2 304) after pre-charge starts (e.g., T1 302). The period 304 (e.g., T2; operating time of the far-side PC) can be determined/calculated by a difference between the PCB and the PCDB signal falling edges. The present disclosure may shorten bit line pre-charge ending time by supplying voltage from both normal PC and far-side PC, and can decrease a start of a next operation (e.g., a SRAM operation) delays by providing an optimal operating time of the far-side PC.

FIG. 4 illustrates a first implementation of the far-side pre-charger circuit 110 of FIG. 2 in a static random access memory (SRAM), in accordance with some embodiments. The circuit 400 may include an input/output (I/O) circuit 102, an address-decoder circuit 404, a signal delay circuit 106, a plurality of memory arrays 108, a second pre-charger circuit 110, a number of bit lines (BLs) 114, a number of word lines (WLs) 116, a number of word line drivers 410, and a number of word line decoders 410. The circuit 400 of FIG. 4 is substantially similar to the circuit 100 of FIG. 1, except for the detailed address-decoder circuit 404 and the detailed signal delay circuit 106. In some embodiments, the control circuit 104 may include the address-decoder circuit 404. Thus, the following description of the circuit 400 will be focused on the difference.

The address-decoder circuit 404 may include an internal clock (intCLK) signal 402. The internal clock (intCLK) signal 402 may determine a pulse width of at least one word line (WL) signal. A DEC_X2 [7:4]408 can be pre-decode signals of the upper bit address signals, synchronized with the intCLK signal 402. The DEC_X2 [7:4]408 can be used for controlling WL drivers 410 far from I/O units to generate WL signals. A DEC_X2 [3:0] 406 can be pre-decode signals of the lower bit address signals. In some embodiments, each DEC_X2[] can be a pre-decode signal for 64 word lines. One DEC_X2[] may connect to 64 NAND gates. The signal-delay circuit 106 may have wirings parallel to bit lines, which is used to adjust/determine/calculate a delay depending on a BL charging time. The first control signal (e.g., a PCB signal) can be an OR output signal of DEC_X2 [7:4]. The signal delay circuit 106 may generate the second control signal (e.g., the PCDB signal) by adding the delay to the first control signal.

In the present disclosure, a delay of the BL pre-charge ending is greatly suppressed because of using the pre-charge end signal PCDB generated from the start signal PCB near the far-side PC. Therefore, next operations such as read/write can start fast with the short BL pre-charge ending. Furthermore, a short duration of ending BL pre-charge prevents a through current from bit lines to selected memory cells while the memory starts read or write operations. The operations of the circuit 400 of FIG. 4 is substantially similar to the operations of the circuit 100 of FIG. 1.

Figure 5:
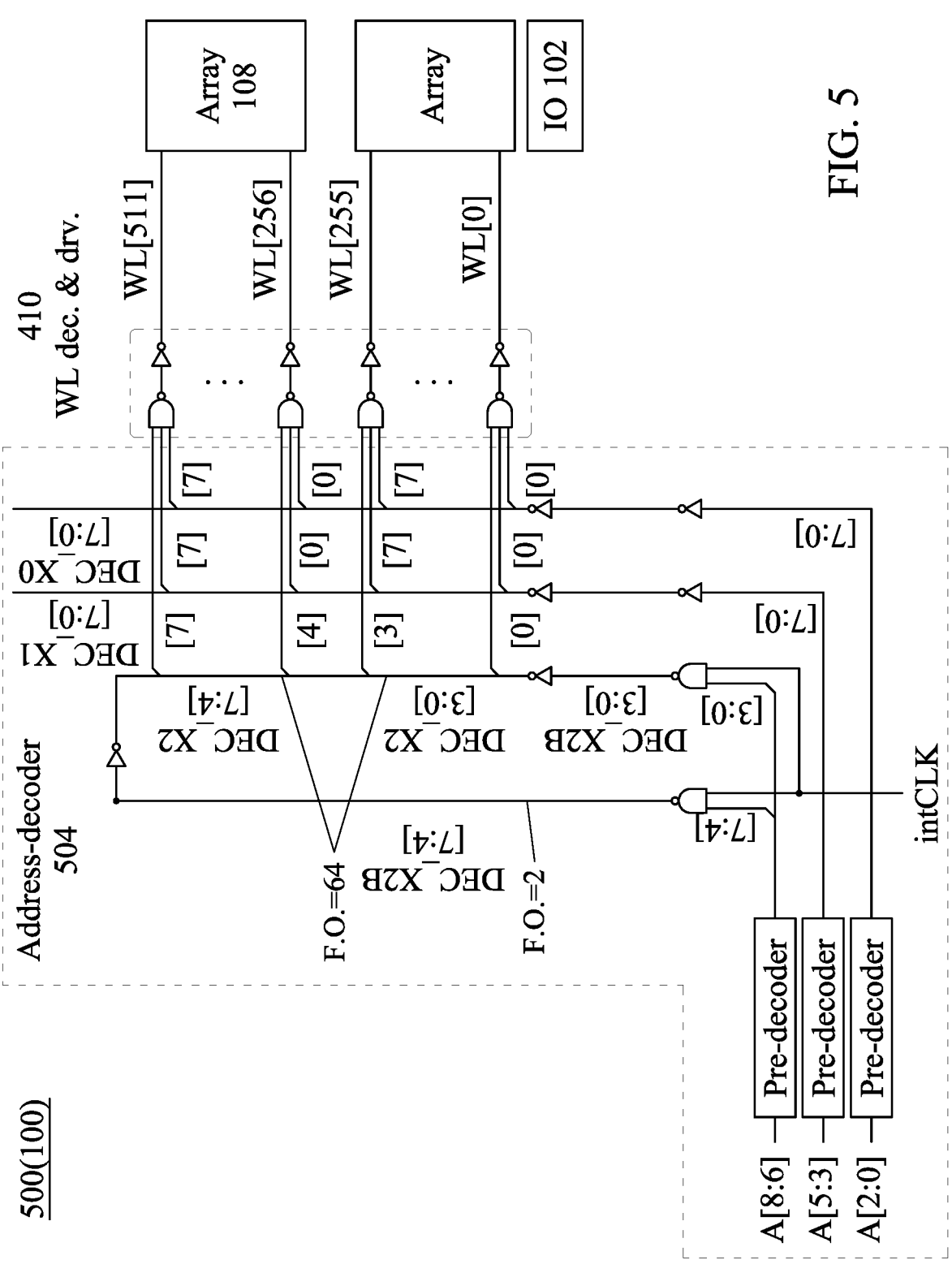
FIG. 5 illustrates an implementation of an address-decoder in a static random access memory (SRAM), in accordance with some embodiments.

FIG. 5 illustrates an implementation of an address-decoder circuit 504 in a static random access memory (SRAM), in accordance with some embodiments. The circuit 500 may include an input/output (I/O) circuit 102, an address-decoder circuit 504, a plurality of memory arrays 108, a number of bit lines (BLs), a number of word lines (WLs), a number of word line drivers 410, and a number of word line decoders 410. The circuit 500 of FIG. 5 is substantially similar to the circuit 100 of FIG. 1, except for the detailed address-decoder circuit 504 to further improve an operation speed. Thus, the following description of the circuit 500 will be focused on the difference.

The address-decoder circuit 504 in case of an example for a memory macro may have 9-bits address and 512 words lines. The address-decoder circuit 504 may have address pins, pre-decoders, and pre-decode signals. An internal clock (intCLK) signal may determine a pulse width of at least one word line (WL) signal. A DEC_X0 [7:0] and a DEC_X1 [7:0] can be signals pre-decoded from low-and mid-order address bits. A DEC_X2 [7:0] signals can be AND output signals of pre-decoded signals (DEC_X2 [7:0]) from upper bits of the address and the intCLK. The DEC_X0[ ], DEC_X1[ ], and DEC_X2[ ] can be inputs of WL decoders 410. The output of the pre-decode signals may drive WL drivers 410 to select a word line (WL). Inverters connected the DEC_X2B [7:4] for selecting word lines (WLs) of memory array far from an I/O unit can be placed on both sides of the DEC_X2[7:4] wirings to reduce loads that inverters drive, by excluding the long wiring loads of the DEC_X2B. Thus, the DEC X2B transmission can be faster. Since DEC_X2B [3:0] wirings (which are shorter than DEC_X2B ones) have smaller loads, the DEC_X2[3:0] signals can reach WL decoders 410 fast. Therefore, inverters connected to DEC_X2[3:0] for selecting a WL of memory close to the I/O unit are placed near the I/O unit. By designing DEC_X0[ ], DEC_X1[ ] signals to reach WL decoders 410 earlier than the intCLK, these do not require an additional inverter to be placed far from the IO unit.

When the intCLK is low, the DEC_X2[7:0] may not be selected. However, the DEC_X0[7:0] and the DECX1[7:0] each may select one of itself according to the address bits. When intCLK becomes high, one of the DEC_X2[7:0] may be selected, and one WL may be selected by the DEC_X2 [7:0] and the other selected DEC_X1, DEC_X0. The address-decoder circuit 504 provides a fast transmission of pre-decoded signals DEC_X2 of upper address bits by excluding long wiring loads of the DEC_X2B, which can fasten selecting WL and improve a memory operation speed.

Figure 6:
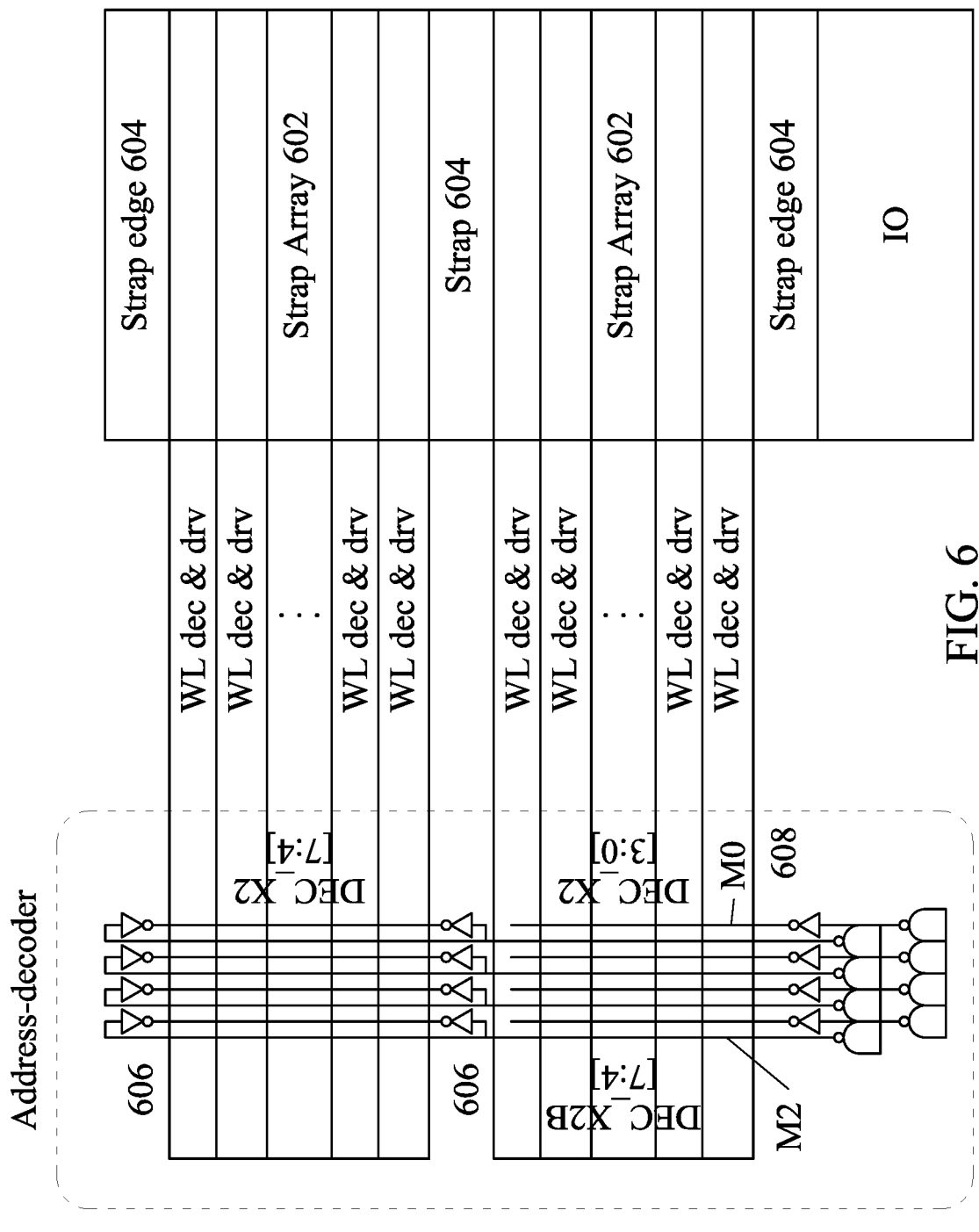
FIG. 6 illustrates a layout diagram of the implementation shown in FIG. 5, in accordance with some embodiments.
Figure 7:
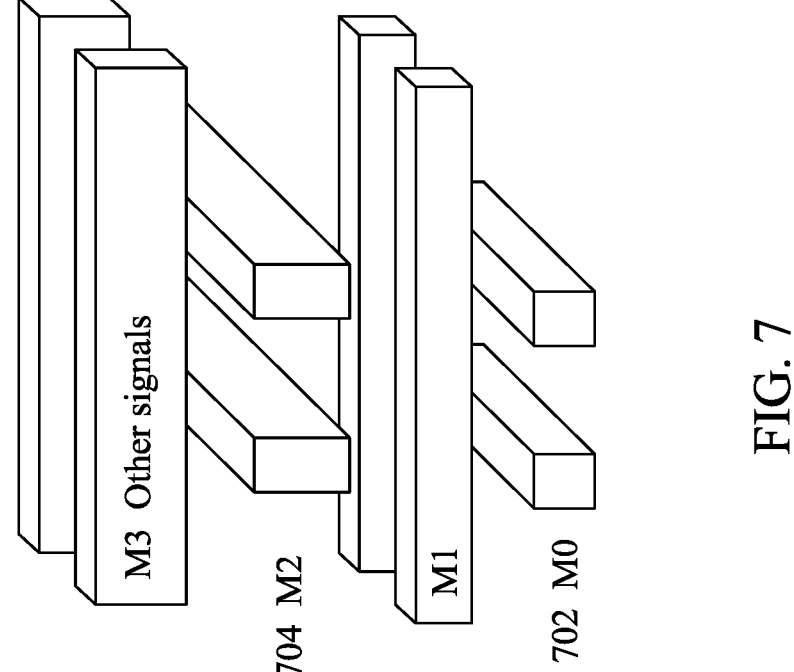
FIG. 7 illustrates a schematic diagram of multi-layer interconnect of the address-decoder layout 600 shown in FIG. 6, in accordance with some embodiments.

FIG. 6 illustrates an address-decoder layout 600 diagram of the implementation shown in FIG. 5, in accordance with some embodiments. FIG. 7 illustrates a schematic diagram of multi-layer interconnect 700 of the address-decoder layout 600 (e.g., M2 layer and M0 layer) shown in FIG. 6, in accordance with some embodiments. The address-decoder layout 600 achieves a smaller area and a faster WL drive speed.

The address-decoder layout 600 includes SRAM arrays 602, strap regions 604 separating the arrays 602, a first group of inverters 606, and a second group of inverters 608. The first group of inverters 606 can be connected to the DEC_X2B[7:4] wires used for selecting word lines (WLs) of memory array far from an I/O unit. The second group of inverters 608 can be placed next to strap regions 604 at the top and center of the memory macro. The inverters connected DEC_X2B[3:0] wires used for selecting WLs of memory array near an I/O unit can be placed next to a strap regions 604 near IO unit. The DEC_X2B[7:4] and the DEC_X2[3:0] wires can be connected to their drivers by upper and bottom layer wrings as shown in FIG. 6, respectively.

Since areas next to the strap regions are vacant, the drivers can be placed in the areas to reduce an increase in a using area. By dividing the DEC_X2B [7:4] and the DEC_X2[3:0] wirings into upper M2 layer 704 and lower MO layer 702 (as shown in FIG. 7), those wiring width can be increased. Therefore, the wiring resistance is reduced, and world lines can be driven faster. For example, the first group of inverters 606 may select one of the DEC_X2[7:4] in M0 layer 702, and the second group of inverters 608 may select one of the DEC_X2[3:0] in M0 layer 702.

Figure 8:
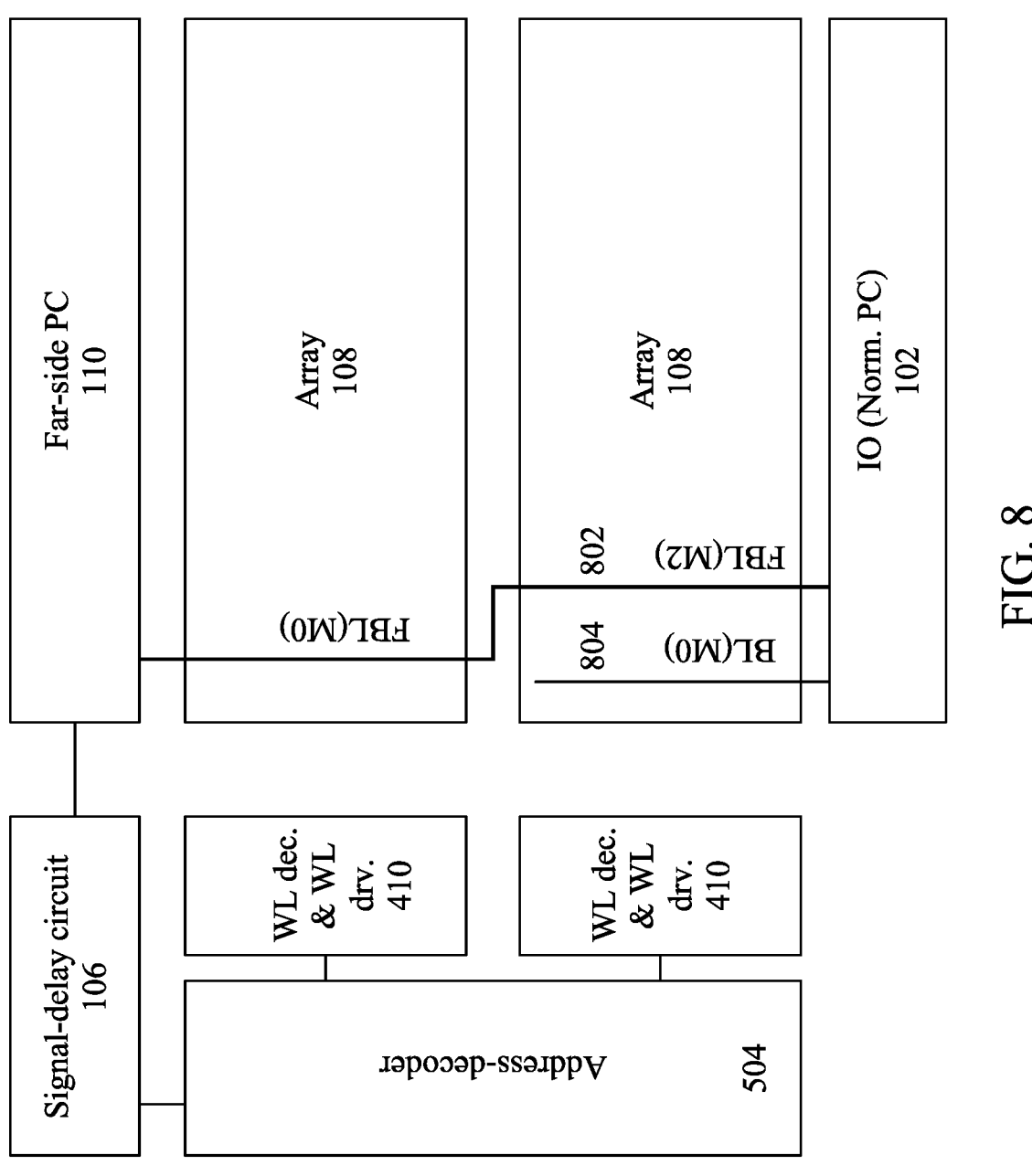
FIG. 8 illustrates a block diagram of a system including a far-side pre-charger circuit, in accordance with some embodiments.

FIG. 8 illustrates a block diagram of a system 800 (e.g., a SRAM macro) including a far-side pre-charger circuit, in accordance with some embodiments. The system 800 may include an input/output (I/O) circuit 102, an address-decoder circuit 504, a signal delay circuit 106, a far-side pre-charger 110, a plurality of memory arrays 108, a number of word line drivers 410, and a number of word line decoders 410. The I/O circuit 102 may include a normal pre-charger. The system 800 of FIG. 8 is substantially similar to the circuit 500 of FIG. 5, except that a flying bit line (FBL) 802 is used/embedded/placed in the system 800. As shown in FIG. 8, by connecting the far-side PC 110 to the at least one flying bit line (FBL) 802, the far-side PC 110 footprint can be reduced. The at least one flying bit line (FBL) 802 may connect to both the far-side PC 110 and the I/O circuit (e.g., near-side PC) 102. When a cell of the plurality of memory arrays 108 connected to the far side PC 110 is selected, the at least one flying bit line (FBL) 802 can be operated in a similar way as the operations of the circuit 100 of FIG. 1. The main difference can be that at least one normal bit line 804 may only connect the I/O circuit (e.g., near-side PC) 102. When a cell of the plurality of memory arrays 108 connected to the at least one normal BL 804 is selected, the near-side PC 102 may start charging the at least one normal BL 804 without activating the far-side PC 110. Since the at least one normal bit line 804 has a short length, the at least one normal bit line 804 can operate faster than the flying bit lines FBLs) 802 even without the far-side PC 110. When a cell of the plurality of memory arrays 108 connected to the at least one normal BL 804 is selected, the far-side PC 110 may not need to switch to an ON-state, which can reduce power consumption.

Figure 9:
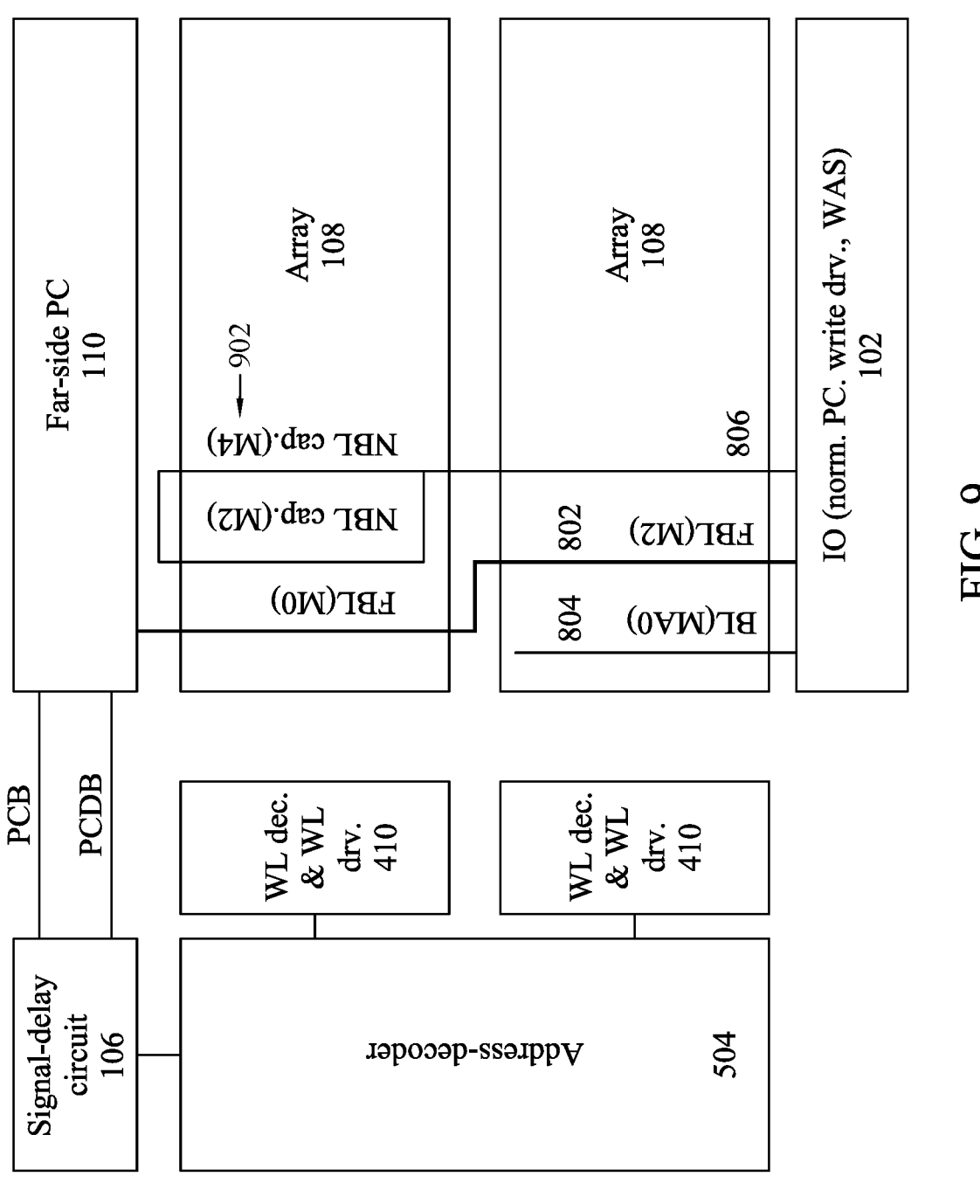
FIG. 9 illustrates a block diagram of a system including a far-side pre-charger circuit, in accordance with some embodiments.
Figure 10:
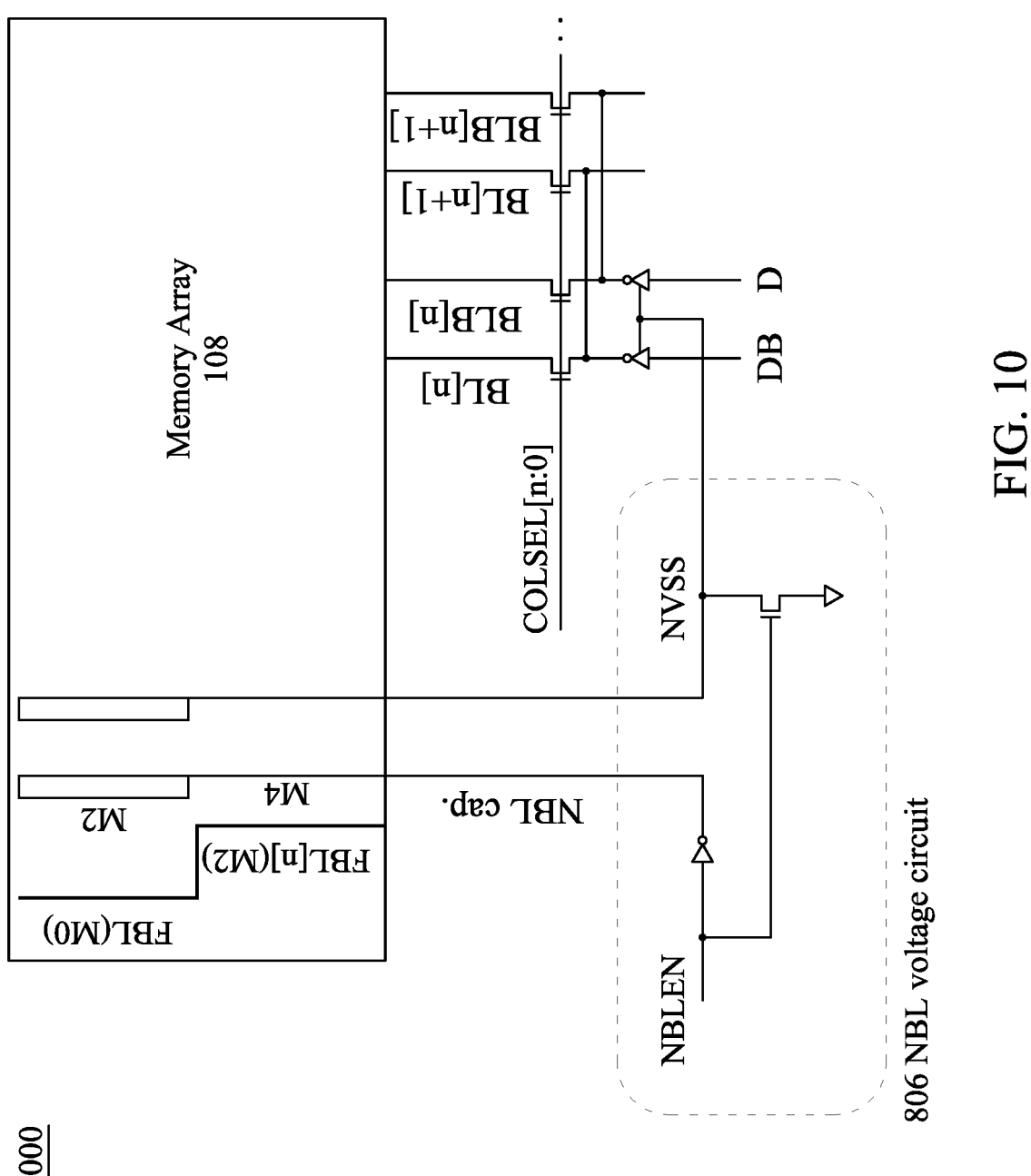
FIG. 10 illustrates a schematic diagram of a negative bit line (NBL) shown in FIG. 9, in accordance with some embodiments.

FIG. 9 illustrates a block diagram of a system 900 (e.g., a SRAM macro) including a far-side pre-charger circuit, in accordance with some embodiments. FIG. 10 illustrates a schematic diagram of a negative bit line (NBL) 1000 shown in FIG. 9, in accordance with some embodiments. The system 900 may include an input/output (I/O) circuit 102, an address-decoder circuit 504, a signal delay circuit 106, a far-side pre-charger 110, a plurality of memory arrays 108, a number of word line drivers 410, a number of word line decoders 410, and a negative bit line (NBL) voltage circuit 806. The system 900 of FIG. 9 is substantially similar to the system 800 of FIG. 8, except that a negative bit line (NBL) voltage circuit 806 is used/embedded/placed in the system 800 to improve ability of write assist (WAS) operation. A negative bit line (NBL) voltage circuit may provide an enhanced voltage difference between a bit line and a memory cell during a write process.

For example in FIG. 9, the system 900 may also include a negative bit line (NBL) voltage circuit 806 using wirings above the flying bit line (FBL) 802. In this configuration, at least one normal bit line 804 may connect to the normal pre-charger 102. At least one flying bit line (FBL) 802 may connect to both the far-side PC 110 and the normal PC 102. At least one NBL capacitor 902 may connect to the plurality of memory arrays 108. For example in FIG. 10, the negative bit line (NBL) write assist circuit 806 include at least one NBL capacitor 902. The least one NBL capacitor 902 can be a capacitor using a metal wring and/or metal oxide semiconductor (MOS) capacitors to generate a negative BL voltage (NVSS). The negative bit line (NBL) write assist circuit may generate a negative voltage level that is applied to the bit line during the write operation. This negative voltage can be lower than the normal operating voltage and may serve to enhance the voltage difference between the bit line and the memory cell being written to. The metal wiring above the FBL (MO) placed at the bottom wiring layer may connect to at least one negative bit line (NBL). The at least one NBL may comprise capacitors constituting a capacitor in a NBL voltage circuit. The NBL circuit 806 can adjust the NVSS in a large range by using additional capacity of the wiring on the flying bit line (FBL). With the help of at least one NBL capacitor 902, the NBL circuit 806 may enhance the voltage difference between the bit line and the memory cell, improving the ability to write and read data reliably.

Figure 11:
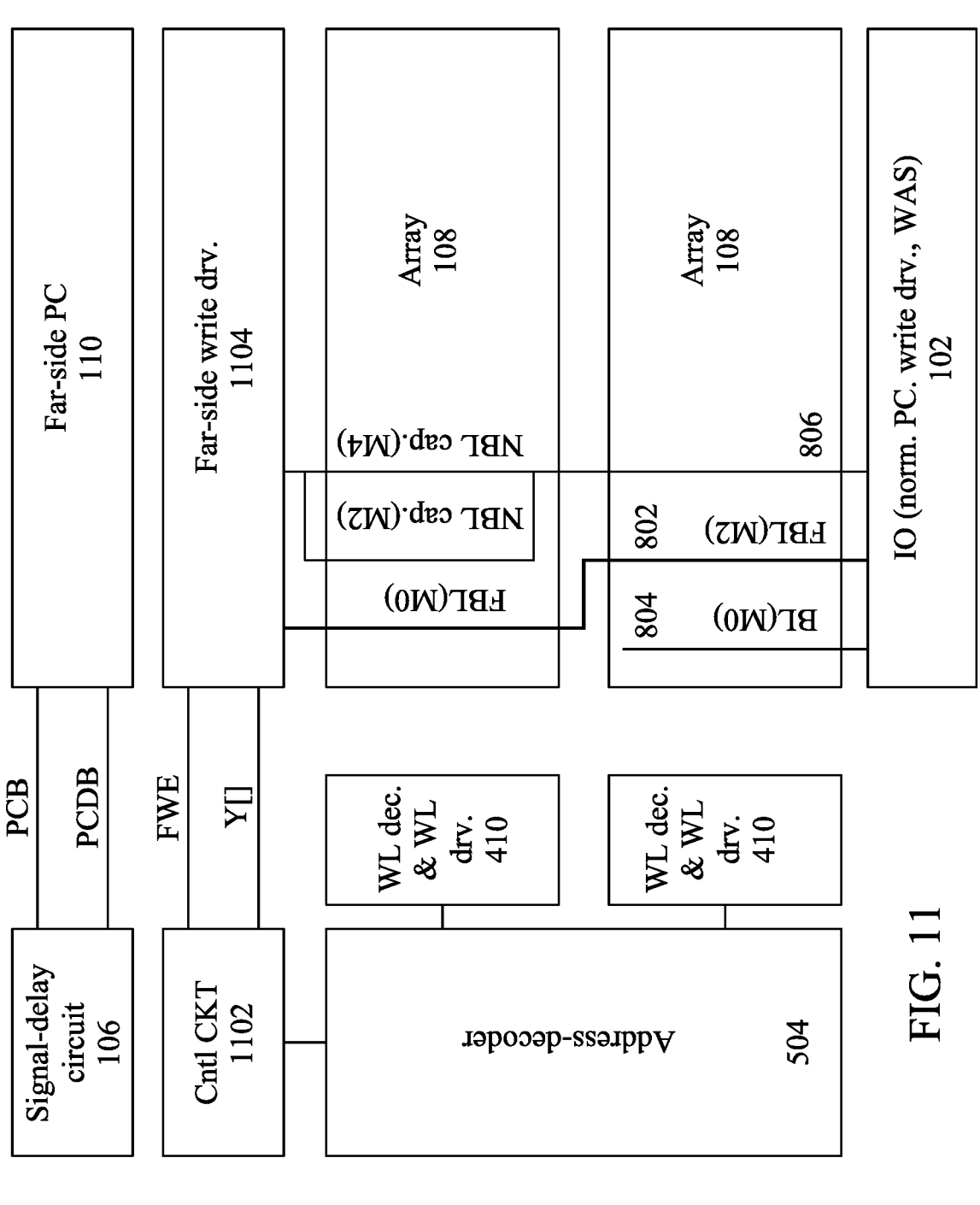
FIG. 11 illustrates a block diagram of a system including a far-side pre-charger circuit, in accordance with some embodiments.
Figure 12:
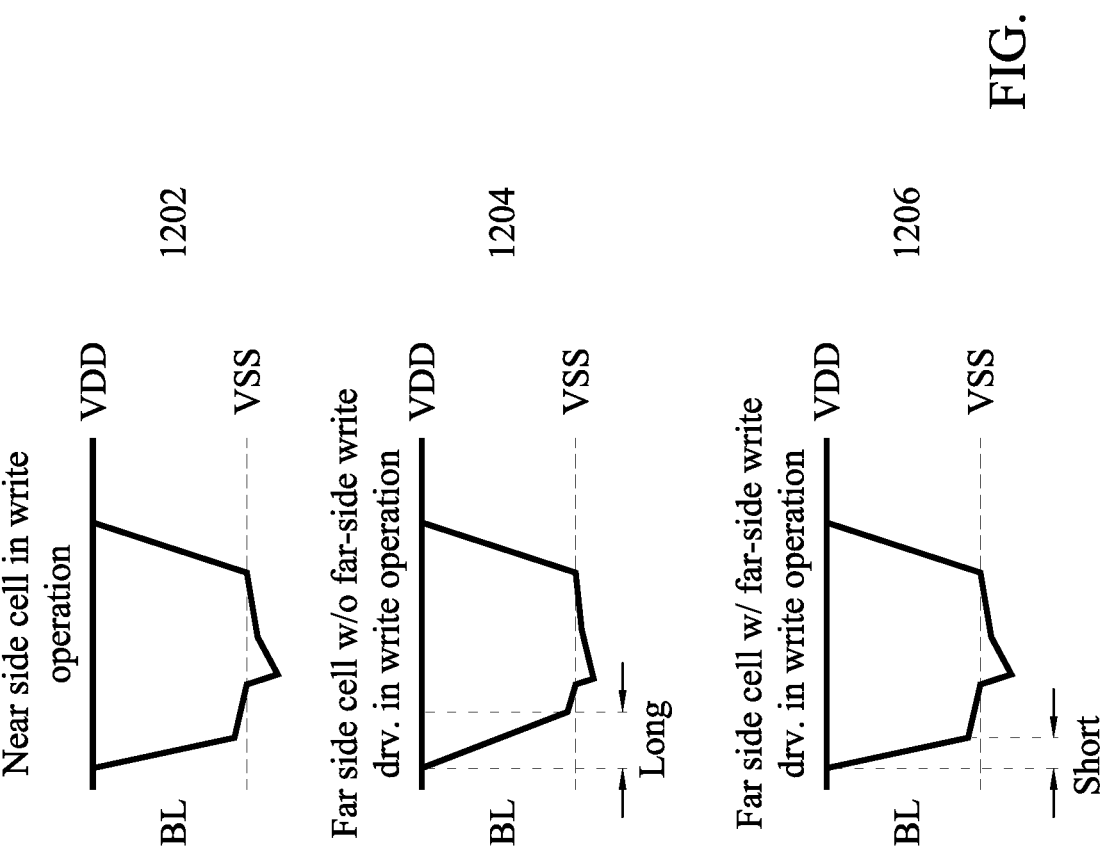
FIG. 12 illustrates waveforms of bit line signals, in accordance with some embodiments.

FIG. 11 illustrates a block diagram of a system 1100 (e.g., a SRAM macro) including a far-side pre-charger circuit, in accordance with some embodiments. FIG. 12 illustrates waveforms 1200 of bit line signals, in accordance with some embodiments. The system 1100 may include an input/output (I/O) circuit 102, an address-decoder circuit 504, a signal delay circuit 106, a far-side pre-charger 110, a control circuit 1102, a far-side write driver 1104, a plurality of memory arrays 108, a number of word line drivers 410, a number of word line decoders 410, and a negative bit line (NBL) voltage circuit 806. The system 1100 of FIG. 11 is substantially similar to the system 900 of FIG. 9, except that a far-side write driver 1104 is used in the system 1100 to improve bit line writing speed. The far- side write driver 1104 can help to discharge bit lines during a write process. The discharge operation helps prepare the bit lines for the next write operation, improving overall performance and reliability of the system 1100.

For example in FIG. 11, the system 1100 may also include a far-side write driver 1104 located far from the I/O unit 102 to fasten a bit line discharge speed and a write operation. The far-side write driver 1104 may have a column select signal Y[ ] and a write control signal FWE. In this configurations, a negative bit line (NBL) voltage can be applied from both upper and bottom sides of memory arrays. For configurations without write assist circuits, negative bit line (NBL) capacitances and write assist (WAS) circuits can be removed.

For example in FIG. 12, during a write operation (1202), a normal write driver 102 in the I/O unit 102 of FIG. 11 discharges bit lines (BLs) to generate an electric potential difference of bit line according to a write data. After a certain delay time, the far-side write driver 1104 may turn on and may assist the bit line discharge (1206). The far-side write driver 1104 may assist in the bit line discharge by providing a path for excess charge to flow out of the bit lines. After a write operation, there may be residual charge remaining on the bit lines, which can interfere with subsequent operations if not properly discharged. In other approaches, during a write operation, especially selecting a memory cell far I/O units, a large load of a long bit line wiring may slow down a BL electric potential change, resulting in slow writing. In the present disclosure, the far-side write driver 1104 can improve the BL writing speed by discharging the BL from an opposite side of an I/O unit.

Figure 13:
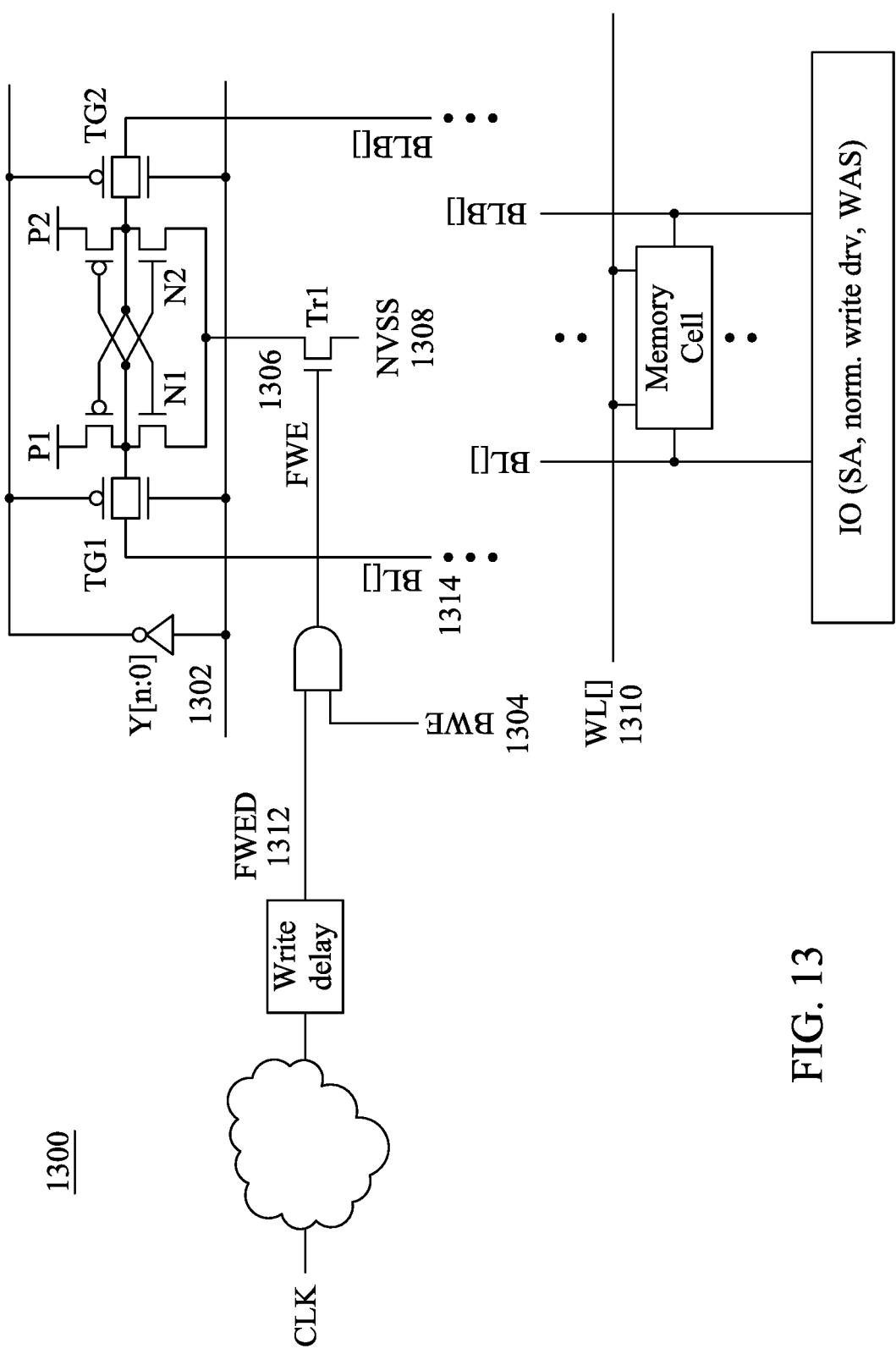
FIG. 13 illustrates a schematic diagram of a far-side write driver shown in FIG. 11, in accordance with some embodiments.
Figure 14:
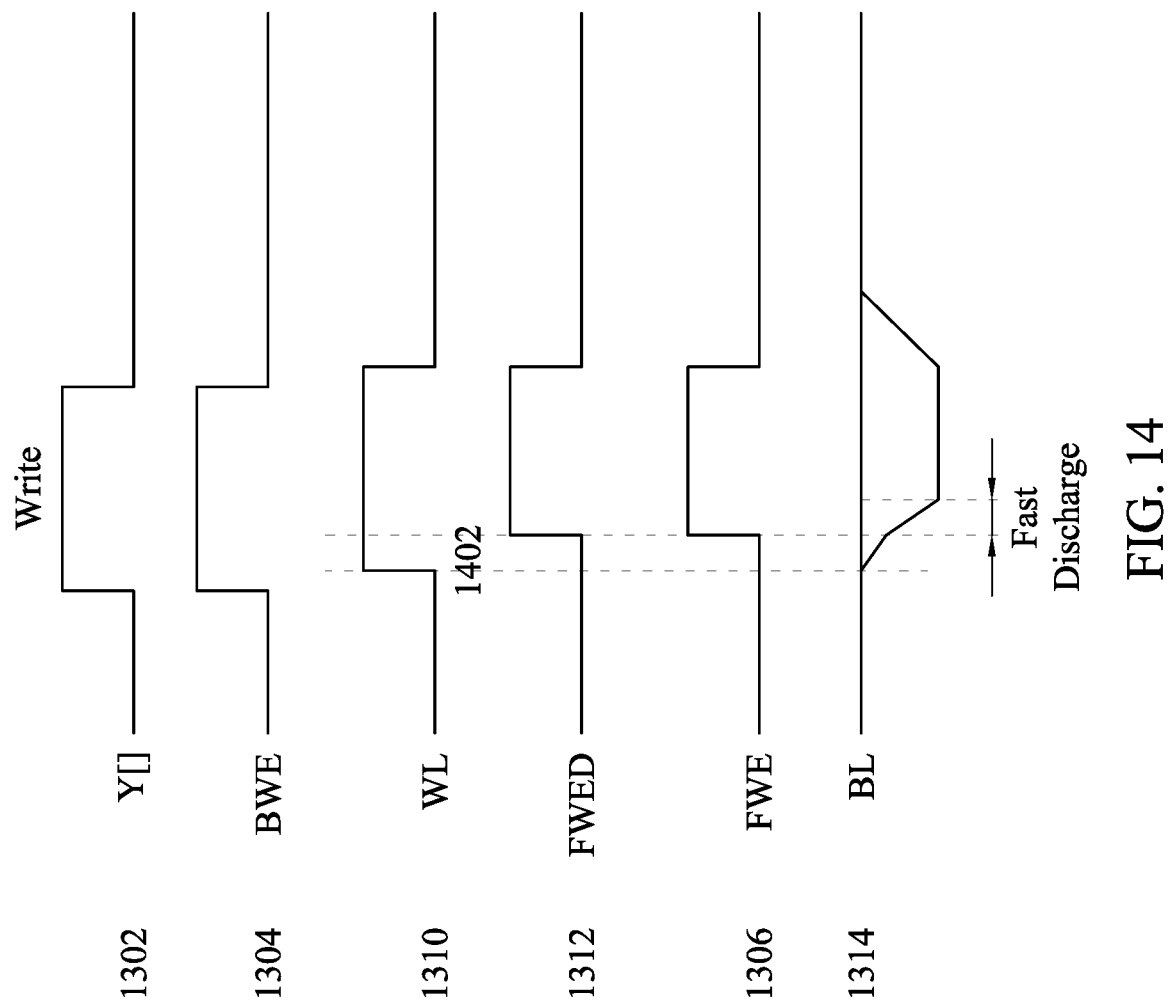
FIG. 14 illustrates waveforms of multiple signals presented by the schematic diagram of FIG. 13, in accordance with some embodiments.

FIG. 13 illustrates a schematic diagram 1300 of a far-side write driver 1104 shown in FIG. 11, in accordance with some embodiments. FIG. 14 illustrates waveforms 1400 of multiple signals presented by the schematic diagram of FIG. 13, in accordance with some embodiments. A far-side write driver 1104 may assist a write operation by enhancing discharge speed of bit line/bit line bar (BL/BLB) far from an I/O block. Y [n: 0] 1302 can be column select signals which are used to select one of BL/BLB sets connected to one I/O unit. A BWE signal 1304 may control writing each I/O unit. A FWE signal 1306 may control an operation of the far-side driver. A negative BL voltage (NVSS) 1308 can be a negative bit line voltage generated by a negative bit line (NBL) voltage circuit.

For example in FIG. 14, in a write operation, the BWE signal 1304 is high, one of the BL/BLB (corresponding to a BL signal 1314) sets is selected by the Y [n:0] 1302, and the FWED 1312 is high after a delay 1402 from a WL (corresponding to a WL signal 1310) rising edge. An inverter latch comprising N1, N2, P1, and P2 may expand a BL/BLB electric potential difference. For memory cells far from an I/O unit, the far-side write driver 1104 can enhance discharge speed of the BL/BLB far from the I/O unit and can fasten write speed.

Without the far-side driver, for memory cells far from an IO unit, a large resistance and capacitance of BL/BLB slows down BL/BLB electric potential change resulting in slow write speed. Since a column select signal is used, one far-side write driver 1104 can be placed in one I/O unit to which multiple BLs are connected, thus the area can be reduced.

Figure 15:
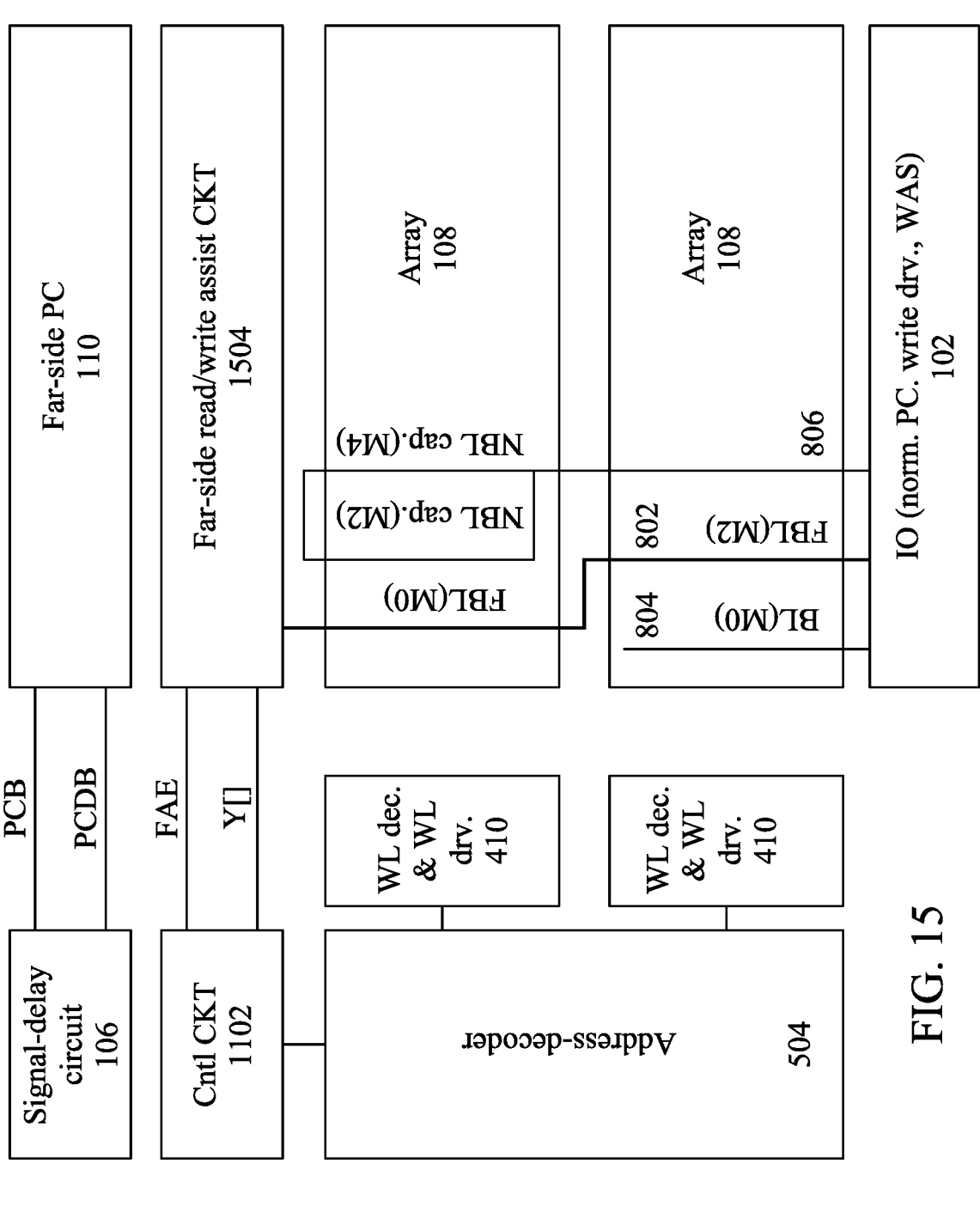
FIG. 15 illustrates a block diagram of a system including a far-side pre-charger circuit, in accordance with some embodiments.
Figure 16:
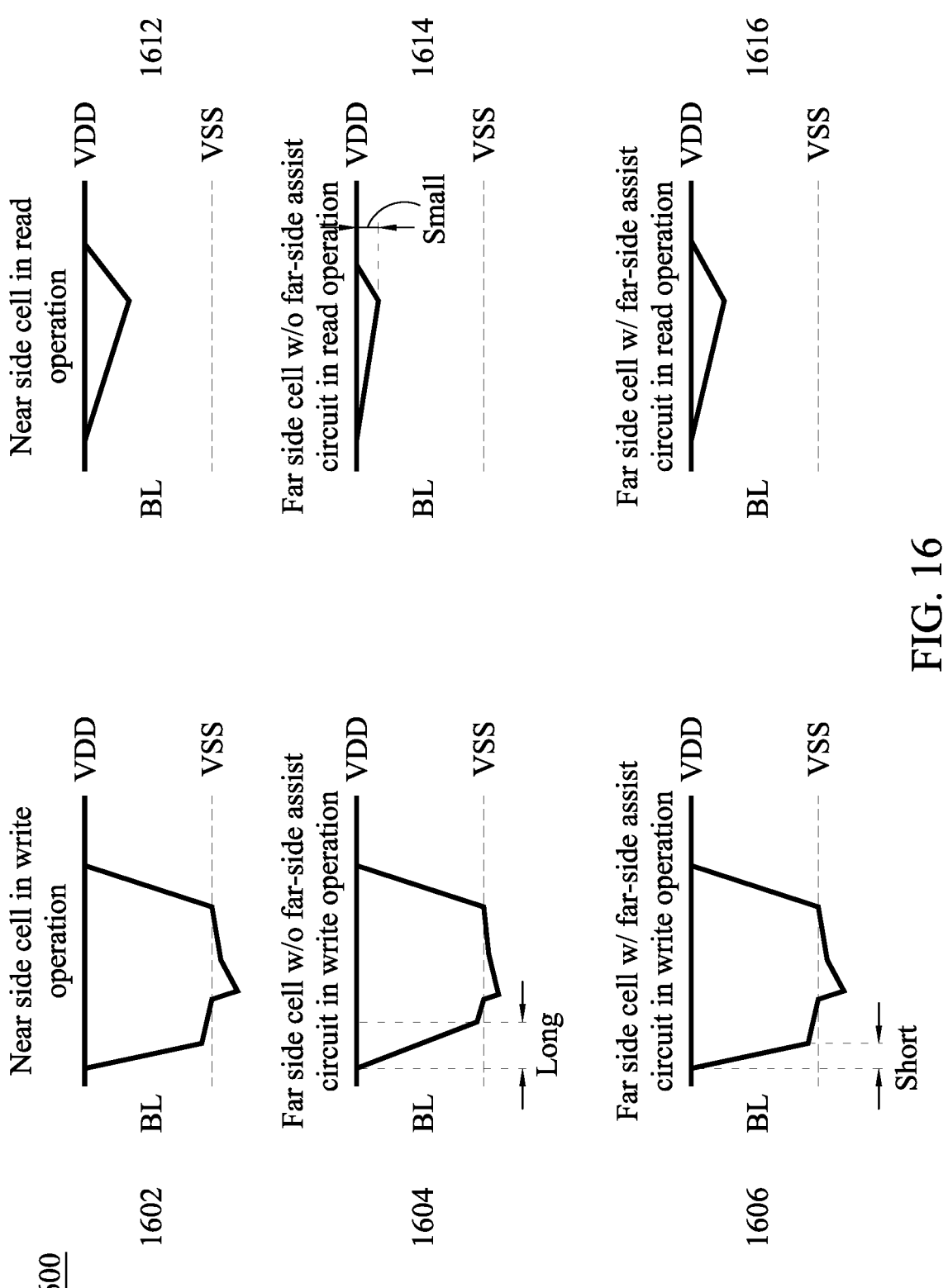
FIG. 16 illustrates waveforms of bit line signals, in accordance with some embodiments.

FIG. 15 illustrates a block diagram of a system 1500 (e.g., a SRAM macro) including a far-side pre-charger circuit, in accordance with some embodiments. FIG. 16 illustrates waveforms 1600 of bit line signals, in accordance with some embodiments. The system 1500 may include an input/output (I/O) circuit 102, an address-decoder circuit 504, a signal delay circuit 106, a far-side pre-charger 110, a far-side read/write assist circuit 1504, a control circuit 1102 of the far-side read/write assist circuit, a plurality of memory arrays 108, a number of word line drivers 410, a number of word line decoders 410, and a negative bit line (NBL) voltage circuit 806. The system 1500 of FIG. 15 is substantially similar to the system 900 of FIG. 9, except that a far-side read/write assist circuit 1504 is used in the system 1500 to fasten read and write operations by a high BL discharge speed. The far-side read/write assist circuit 1504 can help to discharge bit lines during a read operation and/or a write operation. The discharge operation helps prepare the bit lines for the next read and/or write operation, improving overall performance and reliability of the system 1100.

For example in FIG. 15, the system 1500 may also include a far-side read/write assist circuit 1504 located far from an I/O unit. The control circuit 1102 may have a column select signal Y and an assist control signal FAE.

For example in FIG. 16, during a write operation (1602), a normal write driver 102 in the I/O unit 102 of FIG. 15 discharges BLs to generate an electric potential difference of BL according to a write data. The far-side write driver 1504 may turn on and can assist the BL discharge (1606). Without the far-side read/write assist circuit (1604), the BL discharge time may be longer. Although in a write operation, especially selecting a memory cell far I/O units, a large load of a long bit line wiring may slow down a BL electric potential change, resulting in slow writing. The far-side read/write assist circuit 1504 improves the BL writing speed by assisting the discharge of the BL from an opposite side of an IO unit.

During a read operation (1612), discharging a bit line through a selected memory cell generates an electric potential difference of the BL/BLB according to a memory cell data. The far-side read/write assist circuit 1504 may turn on and can assist the BL discharge (1616). Without the far-side read/write assist circuit (1614), a BL electric potential change can be smaller. Although in a read operation, especially selecting a memory cell far I/O units, a large load of a long bit line wiring slows down a BL electric potential change, resulting in a slow reading. The far-side read/write assist circuit 1504 improves the BL reading speed by assisting the discharge of the BL from an opposite side of an IO unit. In some embodiments, if a far-side read/write assist circuit that lowers the maximum voltage of the BL is used, both the near-side PC and the far-side PC can charge the BL to a VDD level quickly.

Figure 17:
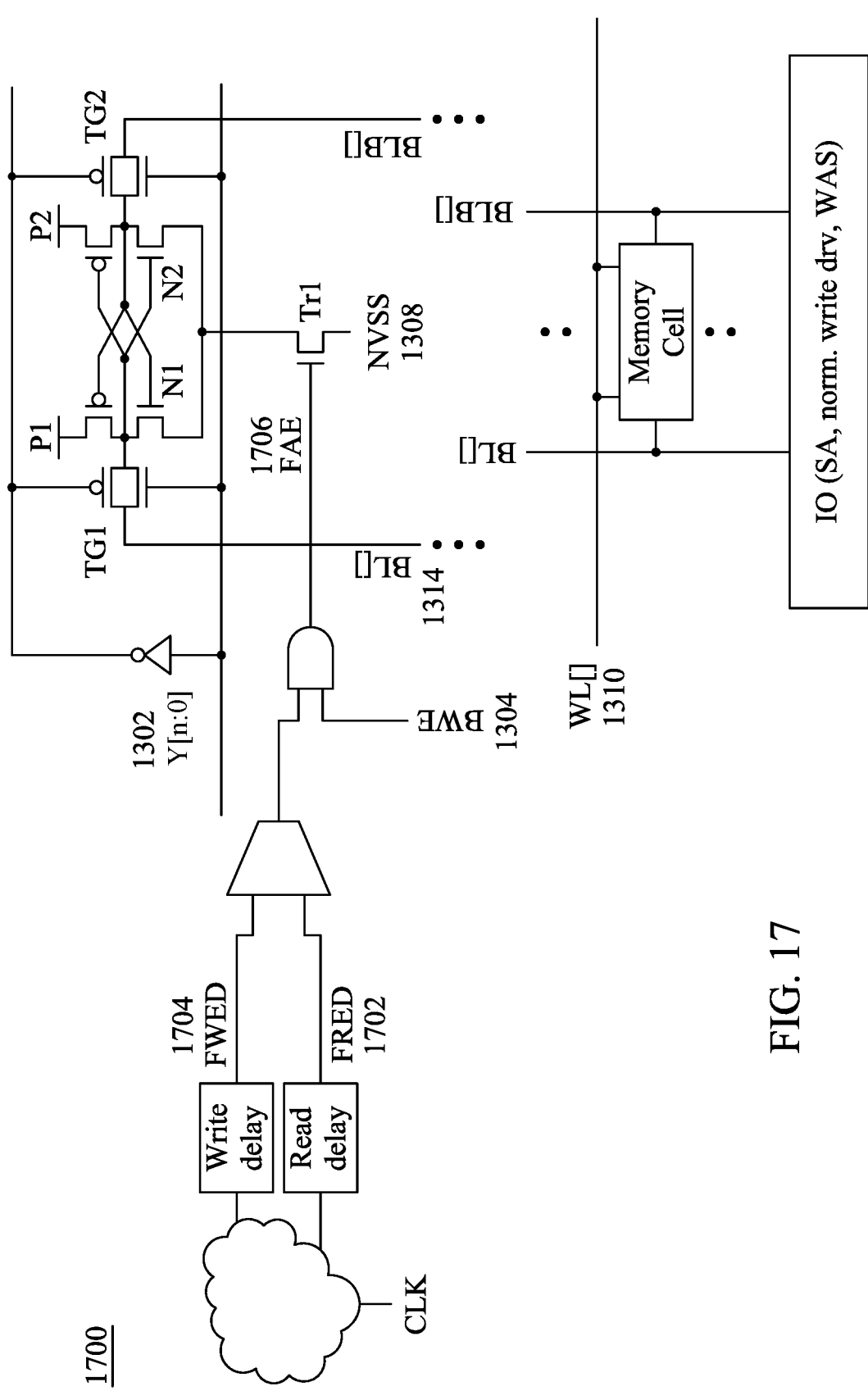
FIG. 17 illustrates a schematic diagram of a far-side read/write assist circuit shown in FIG. 15, in accordance with some embodiments.
Figure 18:
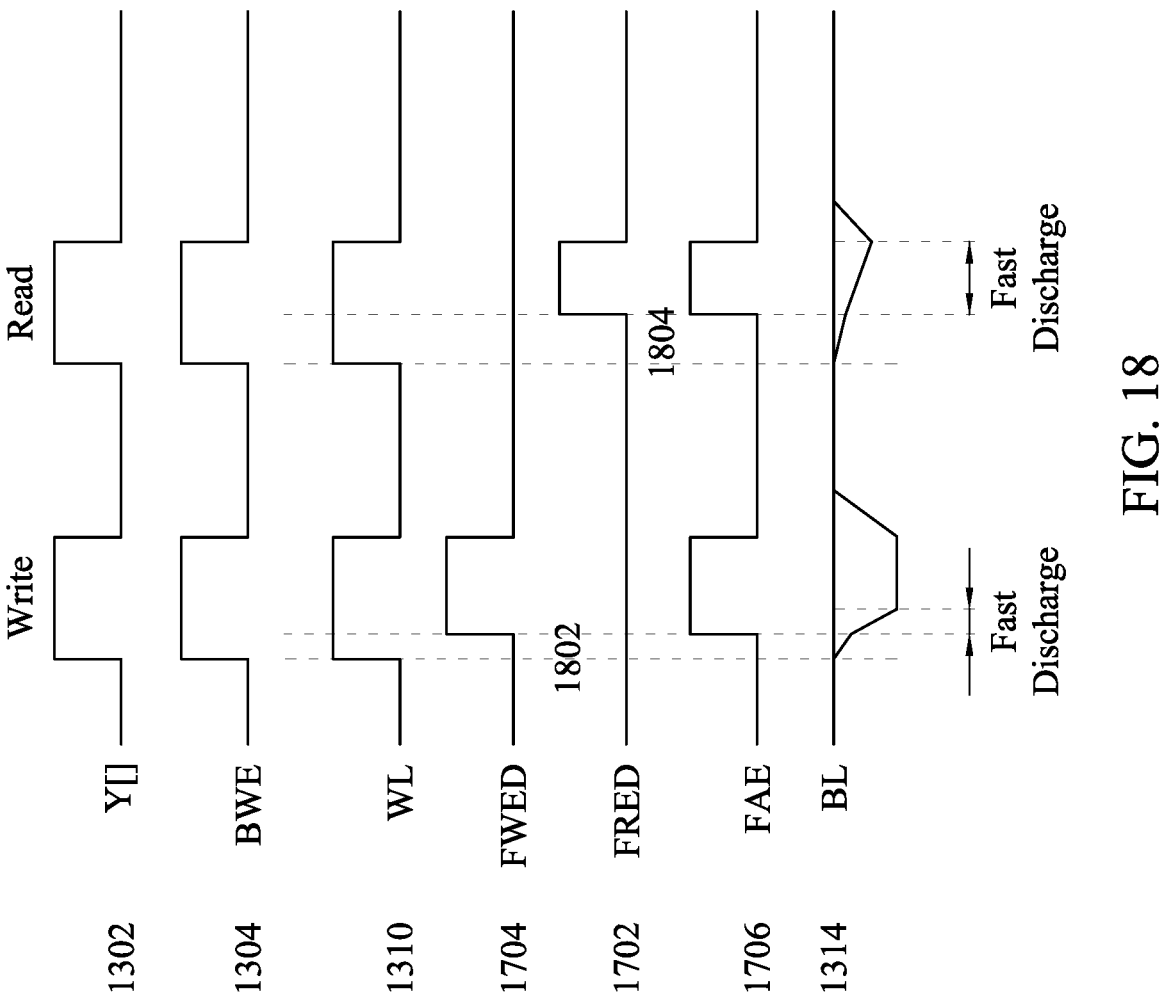
FIG. 18 illustrates waveforms of multiple signals presented by the schematic diagram of FIG. 17, in accordance with some embodiments.

FIG. 17 illustrates a schematic diagram 1700 of a far-side read/write assist circuit shown in FIG. 15, in accordance with some embodiments. FIG. 18 illustrates waveforms 1800 of multiple signals presented by the schematic diagram of FIG. 17, in accordance with some embodiments.

A far-side read/write assist circuit assists both read and write operations by enhance discharge speed of BL/BLB far from an I/O block. Y[n:0] 1302 can be column select signals which are used to select one of BL/BLB sets connected to one I/O unit. A BWE signal 1304 may control writing and reading each I/O unit. A FAE signal 1706 may control an operation of the far-side read/write assist circuit. A negative BL voltage (NVSS) 1308 can be a negative bit line voltage generated by a NBL voltage circuit. The FWED 1704 and FRED 1702 signals are used for controlling an operation timing of the assist circuit during read and write operations, respectively. A selector outputs one of these signals as the FAE signal 1706.

For example in FIG. 18, in a write operation, the BWE signal 1304 is high, one of the BL/BLB sets is selected by the Y[n:0] 1302, and the FWED 1704 is high after a delay 1802 from a WL rising edge. An inverter latch composed of N1, N2, P1, and P2 expands a BL/BLB electric potential difference. In a write operation without the far-side assist circuit, for memory cells far from an IO unit, a large resistance and capacitance of BL/BLB slows down BL/BLB electric potential change resulting in slow write speed. However, the far-side assist circuit can fasten this.

In a read operation, the BWE signal 1304 is high, one of the BL/BLB sets is selected by the Y[n:0] 1302 and the FRED 1702 is high after a delay 1804 from a WL rising edge. An inverter latch composed of N1, N2, P1, and P2 expands a BL/BLB electric potential difference. In a read operation without the far-side assist circuit, for memory cells far from an IO unit, a large resistance and capacitance of BL/BLB slows down BL/BLB electric potential change resulting in low read speed. However, the far-side assist circuit can improve the read speed. Since a column select signal is used, one far-side read/write assist circuit can be placed in an I/O unit to which multiple BLs are connected, thus the area can be reduced.

FIG. 19 illustrates a flow chart of an example method 1900 for operating a far-side pre-charger circuit 110, in accordance with some embodiments. The method 1900 may be used to operate the far-side pre-charger circuit 110. For example, at least some of the operations described in the method 1900 can complementarily charge a bit line 114 to a supply voltage on a far side from an I/O unit 102 based on at least one control signal. It is noted that the method 1900 is merely an example and is not intended to limit the present disclosure. Accordingly, it is understood that additional operations may be provided before, during, and after the method 1900 of FIG. 19, and that some other operations may only be briefly described herein.

The method 1900 starts with operation 1902 in which a memory circuit 400 receives a plurality of decoded address bits, in accordance with various embodiments. For example in FIG. 4, the plurality of memory arrays 108 may receive a plurality of decoded address bits from the address-decoder circuit 404. In some embodiments, the address-decoder circuit 404 may provide a plurality of decoded address bits. The plurality of decoded address bits can correspond at least to a first memory array 108 (lower memory arrays) and a second memory array 108 (upper memory arrays). The first memory array 108 and second memory array 108 may share a bit line (or a number of bit lines) 114 that is connected to a first pre-charge circuit 102 and a second pre-charge circuit 110. The first pre-charge circuit 102 can be physically located closer to the first memory array 108 (lower memory arrays), and the second pre-charge circuit 110 can be physically located closer to the second memory array 108 (upper memory arrays).

The method 1900 continues to operation 1904 in which the memory circuit 400 may synchronize only a portion of the plurality of decoded address bits with a clock signal 402, in accordance with various embodiments. Continuing with the above example in FIG. 4, the address-decoder circuit 404 may include an internal clock (intCLK) signal 402. A portion of the plurality of decoded address bits can be synchronized with the internal clock signal 402. In certain embodiments, the portion of decoded address bits may correspond to the second memory array 108.

The method 1900 continues to operation 1906 in which the memory circuit 400 may generate a first control signal based on the synchronized portion of decoded address bits, in accordance with various embodiments. Continuing with the above example in FIG. 4, the address-decoder circuit 404 may generate a first control signal 210. The first control signal can be transmitted to the signal delay circuit 106 and the second pre-charger circuit 110.

The method 1900 continues to operation 1908 in which the memory circuit 400 may delay the first control signal 210 as a second control signal 212, in accordance with various embodiments. Continuing with the above example in FIG. 4, the signal delay circuit 106 may generate a second control signal 212 by adding the delay to the first control signal 210.

The method 1900 continues to operation 1910 in which the memory circuit 400 may activate the second pre-charge circuit 110 only for a first time period within a second time period, in accordance with various embodiments. For example in FIG. 3, the far-side PC 110 can be controlled with by the first control signal (e.g., the pre-charge start signal PCB 210) and the second control signal (e.g., the pre-charge end signal PCDB 212) to charge the bit line to a supply voltage. The second pre-charge circuit (e.g., the far-side PC 110) may supply charges to the bit line only for the first time period (e.g., T2 304), while the first pre-charge circuit (e.g., the normal PC 102) remains activated throughout the second time period (e.g., T1 302) to charge the bit line to the supply voltage.

In one aspect of the present disclosure, a memory circuit is disclosed. The memory circuit may include a plurality of first memory cells. The plurality of first memory cells can be operatively coupled to a first bit line. The memory circuit may further include a first pre-charge circuit connected to a first end of the first bit line and configured to charge the first bit line to a supply voltage during a first time period prior to any of the first memory cells being accessed. The memory circuit may further include a second pre-charge circuit connected to a second end of the first bit line and also configured to charge the first bit line to the supply voltage during the first time period. The second pre-charge circuit can be only activated during a second time period at a beginning of the first time period, while the first pre-charge circuit can be activated during a whole of the first time period.

In another aspect of the present disclosure, a memory circuit is disclosed. The memory circuit may include a first memory array including a plurality of first memory cells. The plurality of first memory cells can be operatively coupled to a first bit line. The memory circuit may further include a second memory array including a plurality of second memory cells. The plurality of second memory cells can be also operatively coupled to the first bit line. The memory circuit may further include an input/output (I/O) circuit operatively coupled to both of the first memory array and second memory array. The first memory array can be physically located between the I/O circuit and the second memory array. The memory circuit may further include a first pre-charge circuit contained in the I/O circuit and configured to charge the first bit line to a supply voltage prior to any of the first and second memory cells being accessed. The memory circuit may further include a second pre-charge circuit physically located opposite the second memory array from the first memory array and configured to charge the first bit line to the supply voltage prior to only any of the second memory cells being accessed. The second pre-charge circuit can be activated based on a clock signal, while the first pre-charge circuit can be activated independently of the clock signal.

In yet another aspect of the present disclosure, a method for operating a memory circuit is disclosed. The method may include receiving a plurality of decoded address bits that correspond at least to a first memory array and a second memory array, wherein the first memory array and second memory array may share a bit line that is connected to a first pre-charge circuit and a second pre-charge circuit, and wherein the first pre-charge circuit can be physically located closer to the first memory array and the second pre-charge circuit is physically located closer to the second memory array. The method may include synchronizing only a portion of the plurality of decoded address bits with a clock signal, wherein the portion of decoded address bits may correspond to the second memory array. The method may include generating a first control signal based on the synchronized portion of decoded address bits. The method may include delaying the first control signal as a second control signal. The method may include activating, only for a first time period within a second time period, the second pre-charge circuit based on the first control signal and second control signal to charge the bit line to a supply voltage, while the first pre-charge circuit remains activated throughout the second time period to charge the bit line to the supply voltage.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit, comprising:
a plurality of first memory cells, wherein the plurality of first memory cells are operatively coupled to a first bit line;
a first pre-charge circuit connected to a first end of the first bit line and configured to charge the first bit line to a supply voltage during a first time period prior to any of the first memory cells being accessed;
a second pre-charge circuit connected to a second end of the first bit line and also configured to charge the first bit line to the supply voltage during the first time period;
wherein the second pre-charge circuit is only activated during a second time period at a beginning of the first time period, while the first pre-charge circuit is activated during a whole of the first time period, and
wherein the second pre-charge circuit comprises a first transistor and a second transistor directly coupled to each other in series with no other connection therebetween, and the coupled first and second transistors are further coupled between the supply voltage and the first bit line, and wherein the first transistor and the second transistor are gated by a first control signal and a second control signal, respectively.

2. The memory circuit of claim 1, further comprising an input/output (I/O) circuit that includes the first pre-charge circuit.

3. The memory circuit of claim 1, further comprising a delay circuit configured to delay the first control signal as the second control signal, wherein the second pre-charge circuit is activated based on the first control signal and the second control signal.

4. The memory circuit of claim 3, wherein each of the first transistor and the second transistor is a P-type transistor.

5. The memory circuit of claim 3, further comprising a control circuit configured to generate the first control signal based on a portion of a plurality of decoded address bits.

6. The memory circuit of claim 5, wherein the portion of the plurality of decoded address bits correspond to locations of a subset of the first memory cells that are physically located closer to the second end.

7. The memory circuit of claim 5, wherein the portion of the plurality of decoded address bits are synchronized with a clock signal, while one or more remaining portions of the plurality of decoded address bits are not synchronized with the clock signal.

8. The memory circuit of claim 7, wherein the one or more remaining portions of the plurality of decoded address bits correspond to locations of one or more subsets of the first memory cells that are physically located closer to the first end.

9. The memory circuit of claim 5, wherein the control circuit comprises one or more OR gates configured to generate the first control signal based on the portion of the plurality of decoded address bits.

10. The memory circuit of claim 1, further comprising:
a plurality of second memory cells, wherein the plurality of second memory cells are operatively coupled to a second bit line;
wherein the first pre-charge circuit is connected to a first end of the second bit line and configured to charge the second bit line to the supply voltage;
wherein the second pre-charge circuit is connected to a second end of the second bit line and also configured to charge the second bit line to the supply voltage.

11. A memory circuit, comprising:
a first memory array including a plurality of first memory cells, wherein the plurality of first memory cells are operatively coupled to a first bit line;
a second memory array including a plurality of second memory cells, wherein the plurality of second memory cells are also operatively coupled to the first bit line;
an input/output (I/O) circuit operatively coupled to both of the first memory array and second memory array, wherein the first memory array is physically located between the I/O circuit and the second memory array;
a first pre-charge circuit contained in the I/O circuit and configured to charge the first bit line to a supply voltage prior to any of the first and second memory cells being accessed;
a second pre-charge circuit physically located opposite the second memory array from the first memory array and configured to charge the first bit line to the supply voltage prior to only any of the second memory cells being accessed;
wherein the second pre-charge circuit is activated based on a clock signal, while the first pre-charge circuit is activated independently of the clock signal, and
wherein the second pre-charge circuit comprises a first transistor and a second transistor directly coupled to each other in series with no other connection therebetween, and the coupled first and second transistors are further coupled between the supply voltage and the first bit line, and wherein the first transistor and the second transistor are gated by a first control signal and a second control signal, respectively.

12. The memory circuit of claim 11, further comprising a delay circuit configured to delay the first control signal as the second control signal, wherein the second pre-charge circuit is activated based on the first control signal and the second control signal.

13. The memory circuit of claim 12, wherein each of the first transistor and the second transistor is a P-type transistor.

14. The memory circuit of claim 12, further comprising a control circuit configured to generate the first control signal based on the clock signal and a portion of a plurality of decoded address bits.

15. The memory circuit of claim 14, wherein the portion of the plurality of decoded address bits correspond to locations of the plurality of second memory cells.

16. The memory circuit of claim 14, wherein the portion of the plurality of decoded address bits are synchronized with the clock signal, while one or more remaining portions of the plurality of decoded address bits are not synchronized with the clock signal.

17. The memory circuit of claim 16, wherein the one or more remaining portions of the plurality of decoded address bits correspond to locations of the plurality of first memory cells.

18. The memory circuit of claim 14, wherein the control circuit comprises one or more OR gates configured to generate the first control signal based on the portion of the plurality of decoded address bits.

19. A method for operating a memory circuit, comprising:
receiving a plurality of decoded address bits that correspond at least to a first memory array and a second memory array, wherein the first memory array and second memory array share a bit line that is connected to a first pre-charge circuit and a second pre-charge circuit, and wherein the first pre-charge circuit is physically located closer to the first memory array and the second pre-charge circuit is physically located closer to the second memory array;
synchronizing only a portion of the plurality of decoded address bits with a clock signal, wherein the portion of the plurality of decoded address bits correspond to the second memory array;
generating a first control signal based on the synchronized portion of the plurality of decoded address bits;
delaying the first control signal as a second control signal; and
activating, only for a first time period within a second time period, the second pre-charge circuit based on the first control signal and second control signal to charge the bit line to a supply voltage, while the first pre-charge circuit remains activated throughout the second time period to charge the bit line to the supply voltage, wherein the second pre-charge circuit comprises a first transistor and a second transistor directly coupled to each other in series with no other connection therebetween, and the coupled first and second transistors are further coupled between the supply voltage and the bit line, and wherein the first transistor and the second transistor are gated by the first control signal and the second control signal, respectively.

20. The method of claim 19, wherein the first time period is at a beginning of the second time period, in which the second time period occurs prior to any of the first memory array or the second memory array being accessed.

* * * * *